(12) United States Patent
Yoo et al.

(10) Patent No.: US 7,599,034 B2
(45) Date of Patent: Oct. 6, 2009

(54) THIN FILM TRANSISTOR SUBSTRATE OF A HORIZONTAL ELECTRIC FIELD TYPE LCD AND FABRICATING METHOD THEREOF

(75) Inventors: Soon-Sung Yoo, Kyounggi-do (KR); Youn-Gyoung Chang, Kyounggi-do (KR); Heung-Lyul Cho, Kyounggi-do (KR)

(73) Assignee: LG Display Co., Ltd., Seoul (KR)

( * ) Notice: Subject to any disclaimer, the term of this patent is extended or adjusted under 35 U.S.C. 154(b) by 342 days.

(21) Appl. No.: 11/542,249

(22) Filed: Oct. 4, 2006

(65) Prior Publication Data

US 2007/0024793 A1 Feb. 1, 2007

Related U.S. Application Data

(62) Division of application No. 10/973,886, filed on Oct. 27, 2004, now Pat. No. 7,118,947.

(30) Foreign Application Priority Data

Nov. 4, 2003 (KR) .......................... 2003-0077656

(51) Int. Cl.
 *G02F 1/1343* (2006.01)
(52) U.S. Cl. .................. 349/141; 349/138; 349/156
(58) Field of Classification Search .............. None
 See application file for complete search history.

(56) References Cited

U.S. PATENT DOCUMENTS 5,777,702 A 7/1998 Wakagi et al.

2005/0046776 A1* 3/2005 Ahn et al. .................. 349/141

FOREIGN PATENT DOCUMENTS

| JP | 8-201849 | 8/1996 |
|---|---|---|
| JP | 8-286176 | 11/1996 |
| KR | 2003-79539 | 10/2003 |
| KR | 2003-82648 | 10/2003 |

* cited by examiner

*Primary Examiner*—Uyen Chau N Le
*Assistant Examiner*—Chad H Smith
(74) *Attorney, Agent, or Firm*—Morgan Lewis & Bockius LLP

(57) ABSTRACT

A thin film transistor substrate structure of a horizontal electric field type LCD comprises a plurality of signal lines including a gate, a data, and a common lines disposed on a substrate; the data line intersecting with the gate and common lines, a gate insulating film disposed between the data line and the gate and common lines, a pixel area being defined by the intersection of the data and gate lines; a thin film transistor disposed at the intersection of the data line and gate line; a common and a pixel electrodes both having a portion extended into the pixel area; a protective film disposed over the substrate and the thin film transistor; and at least one pad structure including an upper pad electrode contacting a lower pad electrode within a first contact hole wherein the upper pad electrode is absent from the upper surface of the protective film.

14 Claims, 26 Drawing Sheets

THIN FILM TRANSISTOR SUBSTRATE OF A HORIZONTAL ELECTRIC FIELD TYPE LCD AND FABRICATING METHOD THEREOF

This application is a Divisional of U.S. patent application Ser. No. 10/973,886, filed Oct. 27, 2004 now U.S. Pat. No. 7,118,947, and claims the benefit of the Korea Patent Application No. 2003-0077656 filed on Nov. 4, 2003, both of which are hereby incorporated by reference in their entirety.

BACKGROUND OF THE INVENTION

1. Field of the Invention

The present invention relates to a liquid crystal display, and more particularly to a thin film transistor substrate structure of horizontal electric field applying type and a fabricating method thereof that are capable of simplifying a fabricating process by a three-round mask process including lift-off process.

2. Description of the Related Art

Generally, a liquid crystal display (LCD) controls light transmittance of liquid crystal material using an electric field to display a picture. The liquid crystal displays are largely classified into a vertical electric field type and a horizontal electric field type depending upon the direction that the electric field drives the liquid crystal material.

The vertical electric field type liquid crystal display drives liquid crystal material in a twisted nematic (TN) mode with a vertical electric field formed between a pixel electrode and a common electrode arranged opposite each other on the upper and lower substrate. The liquid crystal display of vertical electric field applying type has an advantage of a large aperture ratio while having a drawback of a narrow viewing angle about 90°.

The horizontal electric field type liquid crystal display drives liquid crystal material in an in plane switch (IPS) mode with a horizontal electric field formed between the pixel electrode and the common electrode arranged in parallel to each other on the lower substrate. The liquid crystal display of horizontal electric field applying type has an advantage of an wide viewing angle about 160°.

Hereinafter, the horizontal electric field type liquid crystal display will be described in detail. The horizontal electric field type liquid crystal display includes a thin film transistor substrate (i.e., a lower substrate) and a color filter substrate (i.e., an upper substrate) joined with each other, a spacer for maintaining a uniform cell gap between two substrates, and a liquid crystal material interposed in the cell gap. The thin film transistor array substrate includes a plurality of signal wirings forming a horizontal electric field for each pixel, a plurality of thin film transistors, and an alignment film coated thereon to align the liquid crystal material. The color filter substrate includes a color filter for implementing a color, a black matrix for preventing a light leakage and an alignment film coated thereon to align the liquid crystal material.

In such a liquid crystal display, the thin film transistor substrate has a complicated fabrication process leading to a significant increase in a manufacturing cost of the liquid crystal display panel. Because the fabrication process involves a semiconductor process requiring a plurality of mask processes. To solve this problem, the thin film transistor substrate structure has been developed to reduce a total number of mask processes, for example, one mask process can accommodate processes such as thin film deposition, cleaning, photolithography, etching, photo-resist stripping and inspection processes, or other suitable techniques. Recently, a four-mask process, one less mask process from an existing five-mask process, is becoming a standard mask process for the thin film transistor.

FIG. 1 is a plan view showing a thin film transistor substrate using a horizontal electric field adopting the related art four-mask process, and FIG. 2 is a cross-sectional view of the thin film transistor substrate taken along I-I' and II-II' lines of FIG. 1. Referring to FIG. 1 and FIG. 2, the thin film transistor substrate includes a gate line 2 and a data line 4 provided on a lower substrate 45 intersecting each other and insulated from each other by a gate insulating film 46 therebetween, a thin film transistor 6 provided at an intersection of the gate line 2 and the date line 4, a pixel electrode 14 and a common electrode 18 provided at a pixel area defined by the intersection structure for forming a horizontal field, and a common line 16 connected to the common electrode 18. Furthermore, the thin film transistor substrate includes a storage capacitor 20 provided at an area where the pixel electrode 14 overlaps the common line 16, a gate pad 24 connected to the gate line 2, a data pad 30 connected to the data line 4 and a common pad 36 connected to the common line 16. The gate line 2 is supplied with a gate signal and the data line 4 is supplied with a data signal and are provided in an intersection structure to define a pixel area 5.

The common line 16 is provided parallel with the gate line 2 and having the pixel area 5 provided in-between. The common line 16 is supplied with a reference voltage for driving the liquid crystal material. The thin film transistor 6 includes a gate electrode 8 connected to the gate line 2, a source electrode 10 connected to the data line 4, and a drain electrode 12 connected to the pixel electrode 14. Furthermore, the thin film transistor 6 includes an active layer 48 overlapping the gate electrode 8 and having a gate insulating film 46 therebetween to define a channel between the source electrode 10 and the drain electrode 12. The thin film transistor 6 allows the pixel signal from the data line 4 to be charged and maintained in the pixel electrode 14 in response to the gate signal from the gate line 2.

The active layer 48 also overlaps the data line 4, a lower data pad electrode 32 and an upper storage electrode 22. An ohmic contact layer 50 is further provided on the active layer 48 to make an ohmic contact with the data line 4, the source electrode 10, the drain electrode 12, and the lower data pad electrode 32. The pixel electrode 14 is connected to the drain electrode 12 of the thin film transistor 6 that is provided at the pixel area 5 via a first contact hole 13 passing through a protective film 52. More precisely, the pixel electrode 14 includes a first horizontal part 14A connected to the drain electrode 12 and provided in parallel with adjacent gate lines 2, a second horizontal part 14B overlapping with the common line 16, and a extended portion 14C provided between the first and second horizontal parts 14A and 14B and arranged in parallel with the first and second horizontal parts 14A and 14B. The common electrode 18 is connected to the common line 16 and is provided at the pixel area 5. Specifically, the common electrode 18 is provided in parallel with the extended portion 14C of the pixel electrode 14 at the pixel area 5.

Accordingly, a horizontal electric field is formed between the pixel electrode 14 to which a pixel signal is supplied via the thin film transistor 6 and the common electrode 18 to which a reference voltage is supplied via the common line 16. Particularly, the horizontal electric field is formed between the extended portion 14C of the pixel electrode 14 and the common electrode 18. Liquid crystal material arranged in the horizontal direction by the horizontal electric field between the thin film transistor substrate and the color filter substrate are rotated due to a dielectric anisotropy. Transmittance of light to the pixel area 5 is varied depending on a rotation extent of the liquid crystal material, thereby implementing a gray level scale.

The storage capacitor 20 comprises the common line 16 and an upper storage electrode 22 overlapping the common line 16. The gate insulating film 46, the active layer 48, and the ohmic contact layer 50 are disposed between the common line 16 and the upper storage electrode 22, thereby insulating each other. A pixel electrode 14 is connected to the upper storage electrode 22 via a second contact hole 21 provided through the protective film 52. The storage capacitor 20 allows a pixel signal charged in the pixel electrode 14 to be maintained until the next pixel signal is charged.

The gate line 2 is connected to a gate driver (not shown) via the gate pad 24. The gate pad 24 comprises a lower gate pad electrode 26 extended from the gate line 2, and an upper gate pad electrode 28 connected to the lower gate pad electrode 26 via a third contact hole 27 passing through the gate insulating film 46 and the protective film 52. The data line 4 is connected to the data driver (not shown) via the data pad 30. The data pad 30 comprises a lower data pad electrode 32 extended from the data line 4, and an upper data pad electrode 34 connected to the lower data pad electrode 32 via a fourth contact hole 33 passing through the protective film 52.

The common line 16 receives a reference voltage from an external reference voltage source (not shown) through the common pad 36. The common pad 36 comprises a lower common pad electrode 38 extended from the common line 16, and an upper common pad electrode 40 connected to the lower common pad electrode 38 via a fifth contact hole 39 going through the gate insulating film 46 and the protective film 52.

A method of fabricating the thin film transistor substrate having the above-mentioned structure using the four-round mask process will be described in detail with reference to FIGS. 3A to 3D. Referring to FIG. 3A, a gate metal pattern group including the gate line 2, the gate electrode 8, the lower gate pad electrode 26, the common line 16, the common electrode 18, and the lower common pad electrode 38 are provided on the lower substrate 45 by the first mask process.

More specifically, a gate metal layer is disposed on the upper substrate 45 by a deposition technique such as sputtering. Then, the gate metal layer is patterned by photolithography and etching process using a first mask to form the gate metal pattern group. The gate metal layer is formed from a metal such as aluminum-group metal, chrome (Cr) or molybdenum (Mo).

Referring to FIG. 3B, the gate insulating film 46 is coated onto the lower substrate 45 which is provided with the gate metal pattern group. Then, a semiconductor pattern including the active layer 48 and the ohmic contact layer 50 are provided followed by a source/drain metal pattern group including the data line 4, the source electrode 10, the drain electrode 12, the lower data pad electrode 32, and the upper storage electrode 22 through the second mask process.

More specifically, the gate insulating film 46, an amorphous silicon layer (i.e., active layer 48), an n+ amorphous silicon layer (i.e., ohmic contact layer 50), and a source/drain metal layer are sequentially disposed on the lower substrate 45 which is provided with the gate metal pattern group by deposition techniques such as plasma enhanced chemical vapor deposition (PECVD) and sputtering, or other suitable technique The gate insulating film 46 is formed from an inorganic insulating material such as silicon nitride ($SiN_x$) or silicon oxide ($SiO_x$). The source/drain metal is made from molybdenum (Mo), titanium (Ti), tantalum (Ta) or a molybdenum alloy, or other suitable material.

Then, a photo-resist pattern is formed on the source/drain metal layer by the photolithography using a second mask. In this case, a diffractive exposure mask having a diffractive exposing part at a channel portion of the thin film transistor is used as a second mask, thereby allowing a photo-resist pattern of the channel portion to have a lower height than other source/drain pattern portion. Subsequently, the source/drain metal layer is patterned by a wet etching process using the photo-resist pattern to provide the source/drain metal pattern group.

Next, the n+ amorphous silicon layer (i.e., ohmic contact layer 50) and the amorphous silicon layer (i.e., active layer 48) are patterned simultaneously by a dry etching process using the same photo-resist pattern to provide the ohmic contact layer 50 and the active layer 48. The photo-resist pattern having a relatively low height is removed from the channel portion by ashing process and thereafter the source/drain metal pattern group and the ohmic contact layer 50 of the channel portion are etched by the dry etching process. Thus, the active layer 48 of the channel portion is exposed to disconnect the source electrode 10 from the drain electrode 12. Then, the photo-resist pattern still disposed on the source/drain metal pattern group is removed by stripping process.

Referring to FIG. 3C, the protective film 52 including the first to fifth contact holes 13, 21, 27, 33 and 39 are formed on the gate insulating film 46 provided with the source/drain metal pattern group by the third mask process. More specifically, the protective film 52 is provided on the gate insulating film 46 is patterned by photolithography and etching process using the third mask to define the first to fifth contact holes 13, 21, 27, 33 and 39. The first contact hole 13 passes through the protective film 52 to expose the drain electrode 12, whereas the second contact hole 21 passes through the protective film 52 to expose the upper storage electrode 22. The third contact hole 27 passes through the protective film 52 and the gate insulating film 46 to connect the upper gate pad electrode to the lower gate pad electrode 26. The fourth contact hole 32 passes through the protective film 52 to expose the lower data pad electrode 32. The fifth contact hole 30 passes through the protective film 52 and the gate insulating film 48 to expose the lower common pad electrode 38. If the source/drain metal pattern group is formed from a metal having a large dry-etching ratio such as molybdenum (Mo), then each of the first, second and fourth contact holes 13, 21 and 33 passing through the drain electrode 12, the upper storage electrode 22 and the lower data pad electrode 32, respectively exposed the side portion of the source/drain metal pattern group. The protective film 50 is formed from an inorganic material identical to that of the gate insulating film 46, or an organic material having a small dielectric constant such as an acrylic organic compound, BCB (benzocyclobutene) or PFCB (perfluorocyclobutane), or other suitable material.

Referring to FIG. 3D, a transparent conductive pattern group including the pixel electrode 14, the upper gate pad electrode 28, the upper data pad electrode 34 and the upper common pad electrode 40 are provided on the protective film 52 by the fourth mask process. More specifically, a transparent conductive film is coated onto the protective film 52 by a deposition technique such as sputtering, or other suitable technique. Then, the transparent conductive film is patterned by photolithography and etching process using a fourth mask to provide the transparent conductive pattern group. The pixel electrode 14 is electrically connected to the drain electrode 12 via the first contact hole 13, and also is electrically connected to the upper storage electrode 22 via the second contact hole 21. The upper gate pad electrode 28 is electrically connected to the lower gate pad electrode 26 via the third contact hole 37. The upper data pad electrode 34 is electrically connected to the lower data pad electrode 32 via the fourth contact hole 33. The upper common pad electrode 40 is electrically connected to the lower common pad electrode 38 via the fifth contact hole 39. The transparent conductive film is formed from indium-tin-oxide (ITO), tin-oxide (TO) or indium-zinc-oxide (IZO), or other suitable material.

The related art thin film transistor substrate of a horizontal electric field type LCD and the fabricating method thereof as mentioned above adopts the four-round mask process, thereby reducing the number of fabricating processes and hence reducing a manufacturing cost compared with those using the five-round mask process. However, since the four-round mask process still has a complicate fabricating process to limit a further cost reduction, there has been required a scheme capable of simplifying the fabricating process even further to save the manufacturing cost.

SUMMARY OF THE INVENTION

Accordingly, the present invention is directed to a thin film transistor substrate for a horizontal electric field type LCD and a fabricating method thereof that substantially obviates one or more of the problems dues to limitations and disadvantages of the related art.

An object of the present invention is to provide a three-round mask process including a lift-off process that significantly simplifies the mask process, redues the manufacturing cost, and achieves the higher production yield.

Additional features and advantages of the present invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a thin film transistor substrate of a horizontal electric field type LCD includes a substrate; a gate line and a common line disposed on the substrate and arranged parallel with each other; a data line disposed on the substrate intersecting with the gate line and the common line, the data line insulated from the gate line and the common line by a gate insulating film therebetween, a pixel area being defined by the intersection of the data line with the gate line; a thin film transistor disposed at the intersection of the data line and the gate line, and connected to the gate line and the data line; a common electrode disposed having a portion extended into the pixel area and connected the common line; a pixel electrode disposed having a portion extended into the pixel area and connected to the thin film transistor, wherein a horizontal electric field is formed by the pixel electrode and the common electrode; a protective film disposed over the common electrode, pixel electrode, data line, gate line, common line, and the thin film transistor; and at least one pad structure including a lower pad electrode and an upper pad electrode, wherein the lower pad electrode is connected to a respective one of the data line, gate line, and common line, and the upper pad electrode is disposed within a first contact hole defined through the protective film to contact the lower pad electrode such that the upper pad electrode is absent from the upper surface of the protective film.

In another aspect, a method of fabricating a thin film transistor substrate of a horizontal electric field type LCD includes the steps of forming a gate metal pattern group including a gate line, a common line, a gate electrode, a common electrode, a pixel electrode, a lower gate pad electrode, and a lower common pad electrode on a substrate, wherein the gate electrode is connected to the gate line, the common line is parallel with the gate line, the lower common pad electrode is connected to the common line, portions of the common electrode is extended from the common line into a pixel area, a portion of pixel electrode extended into the pixel area, and the extended portions of the pixel area and the common electrode form a horizontal electric field in the pixel area; providing a gate insulating film on the substrate and the gate metal pattern group; forming a semiconductor pattern including an active layer and an ohmic contact layer on the gate insulating film; forming a source/drain metal group including a data line, a source electrode, a drain electrode, a lower pad electrode, a first upper storage electrode, and a second upper storage electrode on the semiconductor pattern, wherein the data line crosses the gate line and the common line, the source electrode and the lower data pad electrode are connected to the data line, and the drain electrode is formed opposite to the source electrode; providing a protective film on the source/drain metal group and the thin film transistor to protect the thin film transistor; and patterning the protective film and the gate insulating film disposed on the substrate to provide first to fourth contact holes and a plurality of stripper penetration paths and forming a transparent conductive pattern group including an upper gate pad electrode, an upper common pad electrode, and upper data pad electrode, a contact electrode, and a plurality of dummy transparent conductive pattern, wherein the transparent conductive pattern group is disposed within the first to fourth contact holes and the plurality of stripper penetration paths such that the transparent conductive pattern group is absent from the entire upper surface of the protective film.

In another aspect, a method of fabricating a thin film transistor substrate structure of a horizontal electric field type LCD includes a first mask process including forming a gate metal pattern group on a substrate including a gate line, a common line, a gate electrode, a common electrode, a pixel electrode, a lower common pad electrode, and a lower gate pad electrode, wherein the gate electrode is connected to the gate line, the common line is parallel with the gate line, the lower common pad electrode is connected to the common line, portions of the common electrode is extended from the common line into a pixel area, a portion of pixel electrode extended into the pixel area, and the extended portions of the pixel area and the common electrode form a horizontal electric field in the pixel area; a second mask process including disposing a gate insulating film on the gate metal pattern group, forming a semiconductor pattern including an active layer and an ohmic contact layer on the gate insulating film, forming a source/drain metal group including a data line, a source electrode, a drain electrode, a lower pad electrode, a first upper storage electrode, and a second upper storage electrode on the semiconductor pattern, wherein the data line crosses the gate line and the common line, the source electrode and the lower data pad electrode are connected to the data line, and the drain electrode is formed opposite to the source electrode; a third mask process including disposing a protective film on the source/drain metal group and the thin film transistor, patterning the protective film and the gate insulating film to provide first to fourth contact holes and a plurality of stripper penetration paths, and forming a transparent conductive pattern group including an upper gate pad electrode, an upper common pad electrode, upper data pad electrode, a contact electrode, and a plurality of dummy transparent pattern.

In another aspect, a thin film transistor substrate structure of a horizontal electric field type LCD includes a substrate; a gate line and a common line disposed on the substrate and arranged parallel with each other; a data line disposed on the substrate intersecting with the gate line and the common line, the data line insulated from the gate line and the common line by a gate insulating film therebetween, a pixel area being defined by the intersection of the data line with the gate line; a thin film transistor disposed at the intersection of the data line and the gate line, and connected to the gate line and the data line; a common electrode disposed having a portion extended into the pixel area and connected the common line; a pixel electrode disposed having a portion extended into the pixel area and connected to the thin film transistor, wherein a horizontal electric field is formed by the pixel electrode and the common electrode; a protective film disposed over the common electrode, pixel electrode, data line, data line, common line, and the thin film transistor; first to fourth contact holes and a plurality of stripper penetration paths provided on the substrate; a gate pad including a lower gate pad electrode connected to the gate line and an upper gate pad electrode disposed within a first contact hole defined through the protective film to contact the lower gate pad electrode such that the upper gate pad electrode is absent from the upper surface of the protective film; a common pad including a lower common pad electrode connected to the common line and an upper common pad electrode disposed within a second contact hole defined through the protective film to contact the lower common pad electrode such that the upper common pad electrode is absent from the upper surface of the protective film; a data pad including a lower data pad electrode connected to the data line and an upper data pad electrode disposed within a third contact hole defined through the protective film to contact the lower data pad electrode such that the upper data pad electrode is absent from the upper surface of the protective film; a contact electrode disposed within a fourth contact hole defined through the protective film to contact the portion of pixel electrode and a portion of a drain electrode such that the contact electrode is absent from the upper surface of the protective film; and a plurality of dummy transparent conductive pattern disposed within a plurality of second stripper penetration paths defined through the protective film such that the plurality of dummy transparent conductive pattern are absent from the upper surface of the protective film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
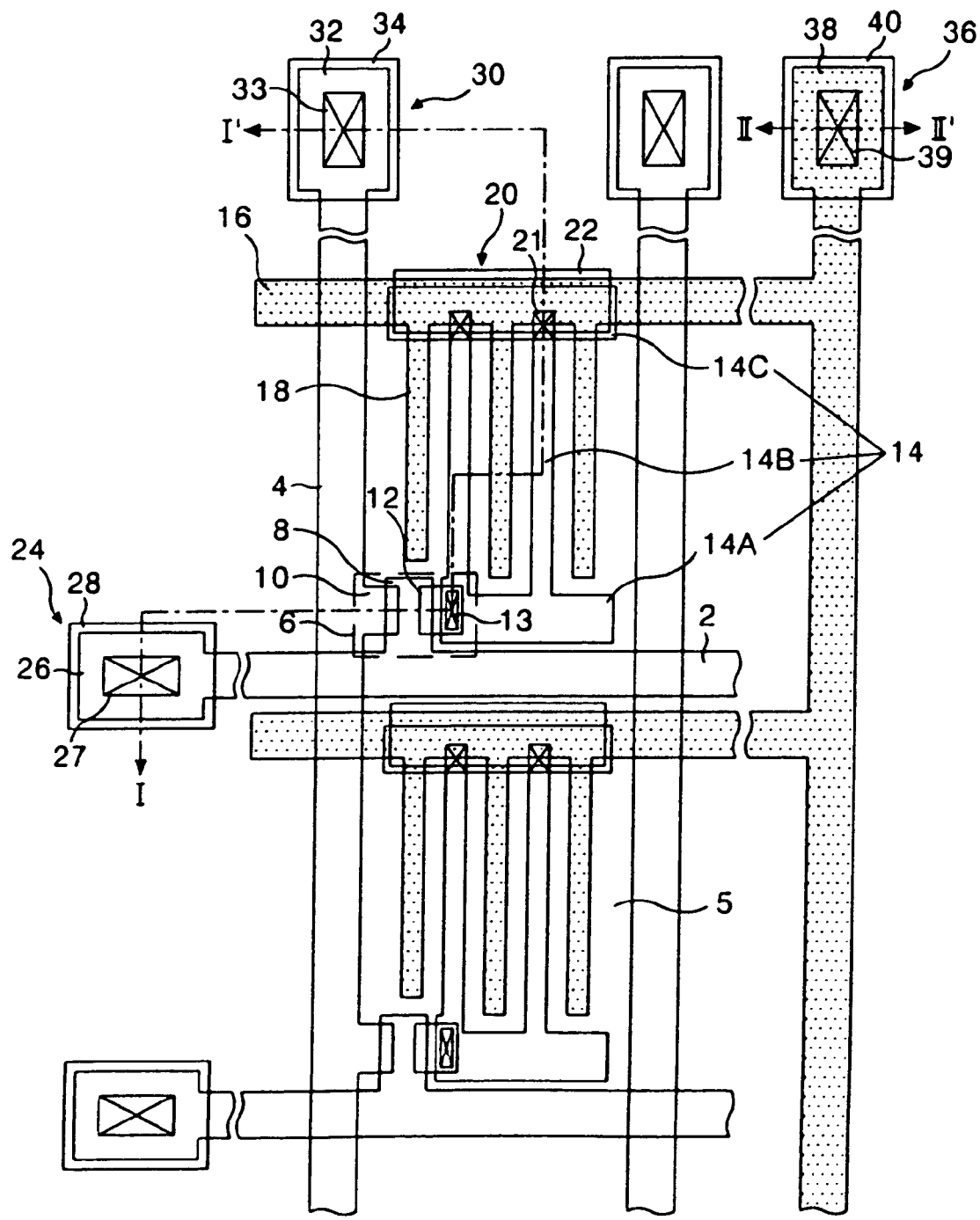
FIG. 1 is a plan view showing a structure of a related art thin film transistor substrate of a horizontal electric field type LCD.
Figure 2:
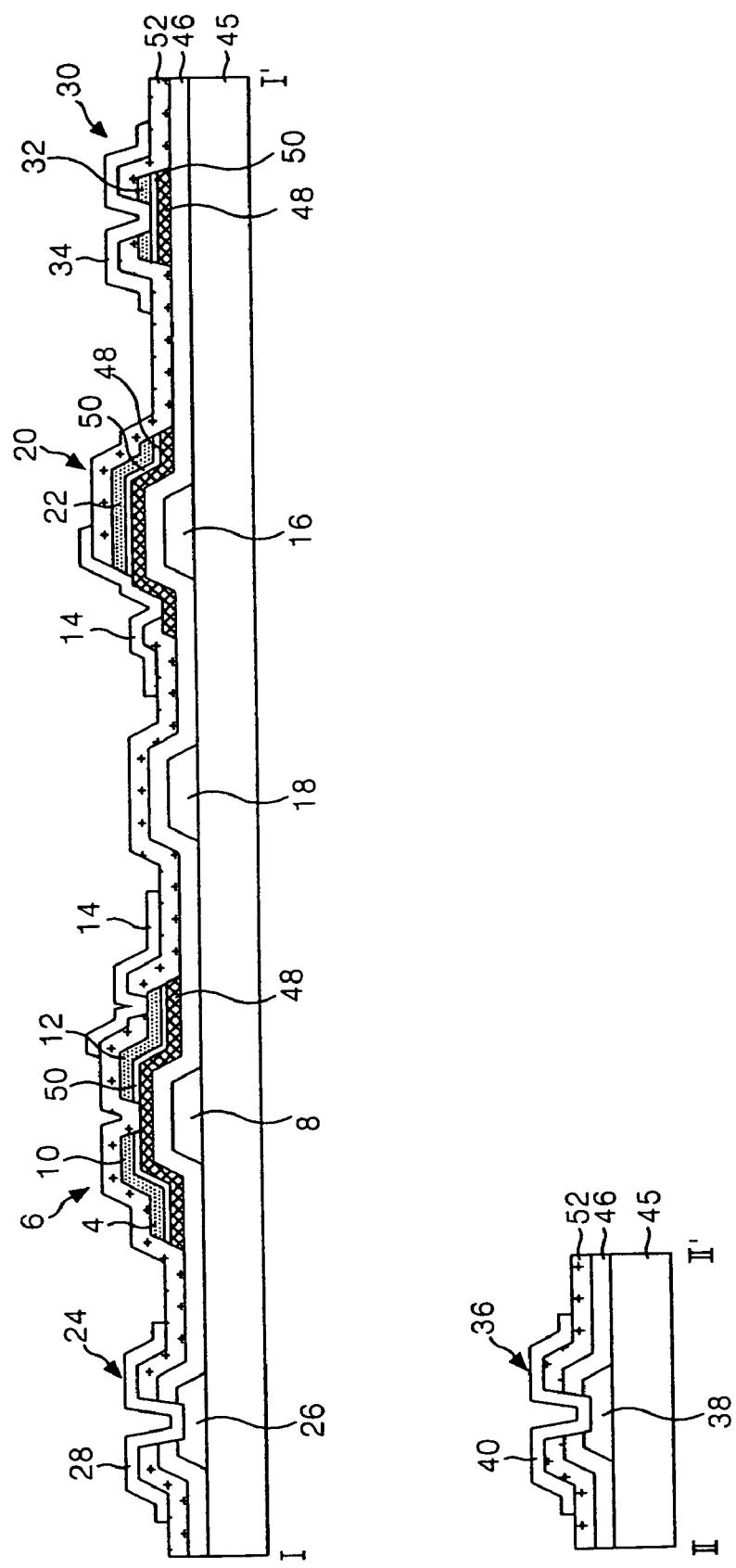
FIG. 2 is a cross-sectional view of the thin film transistor substrate taken along lines I-I' and II-II' of FIG. 1.
Figure 3A:
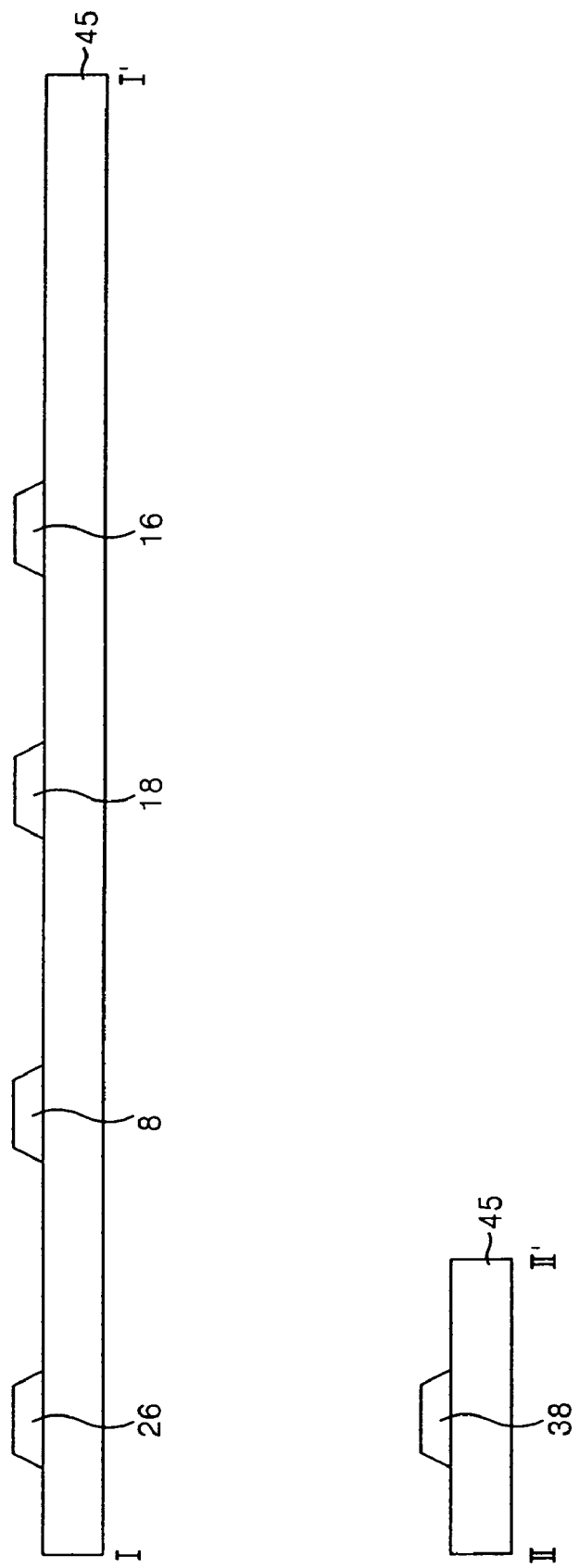
FIGS. 3A to 3D are cross-sectional views illustrating a step-by-step method of fabricating the thin film transistor substrate of FIG. 2.
Figure 3B:
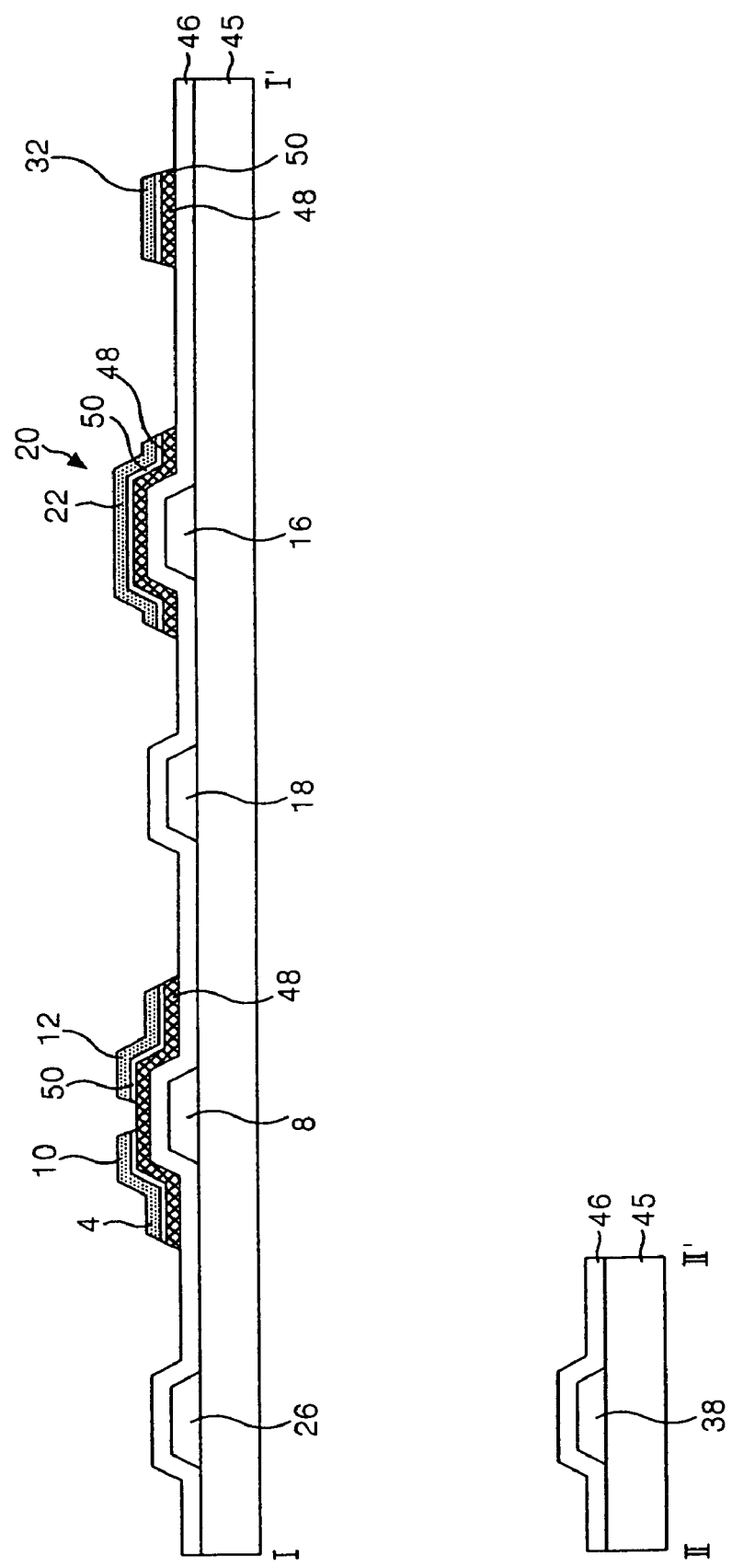
Figure 3C:
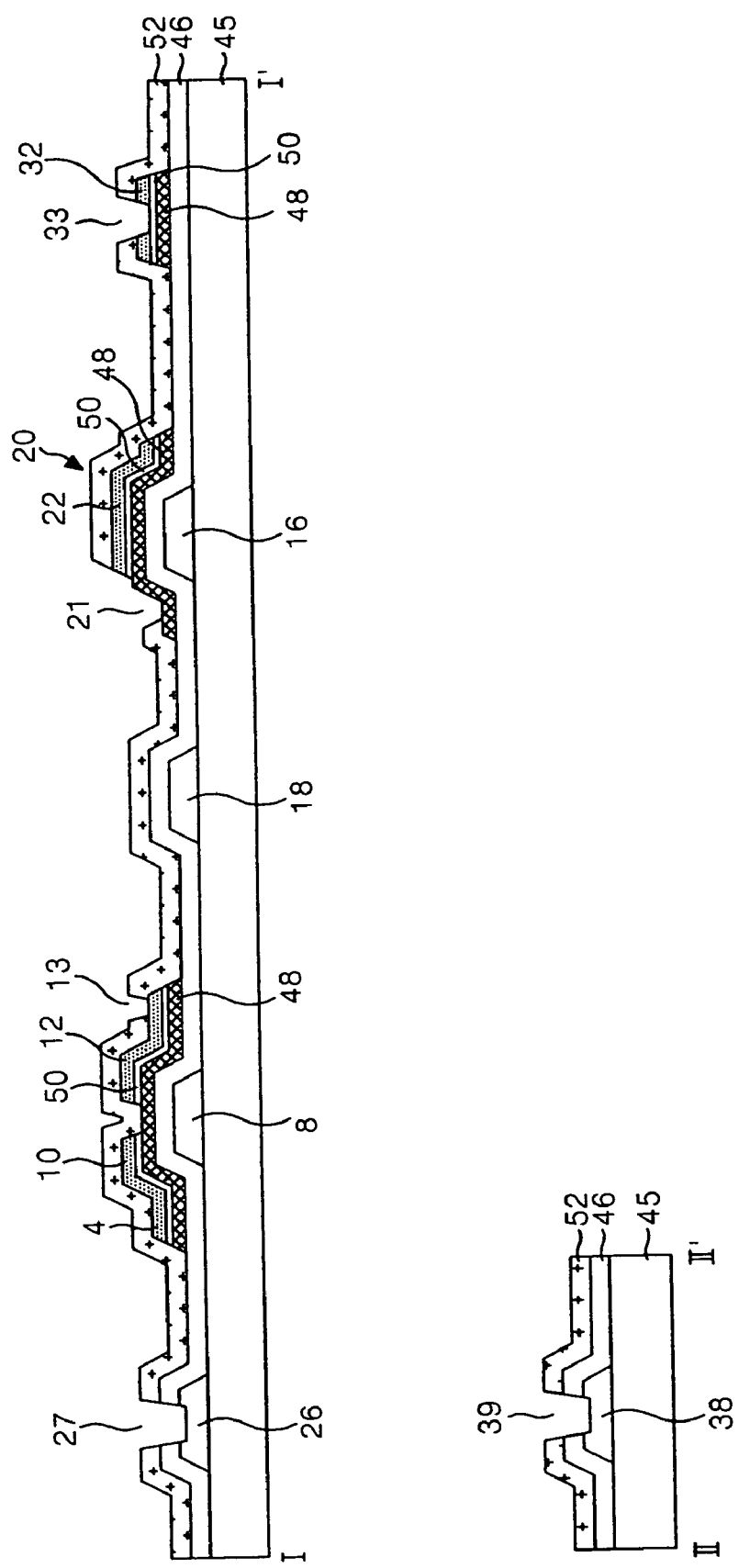
Figure 3D:
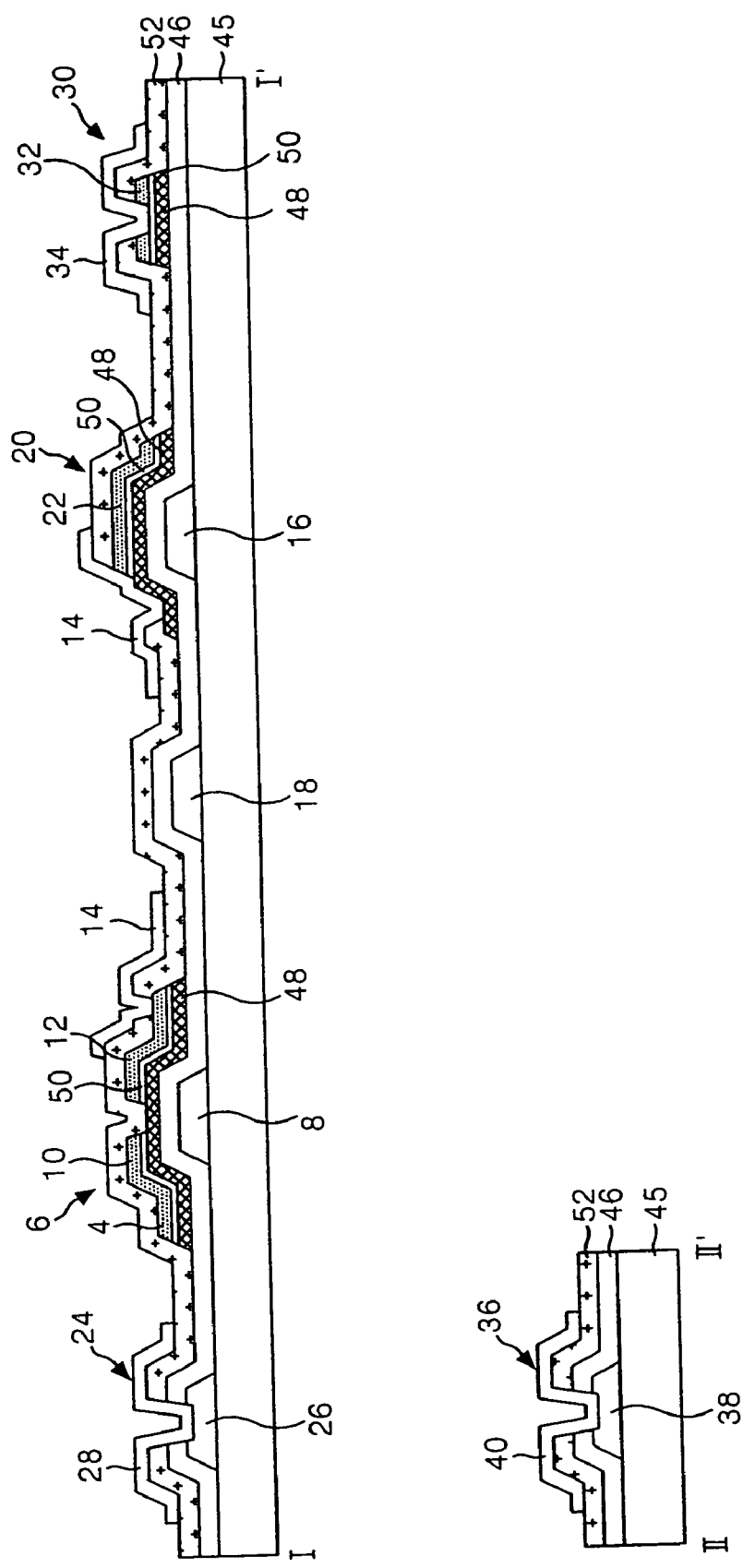
Figure 4:
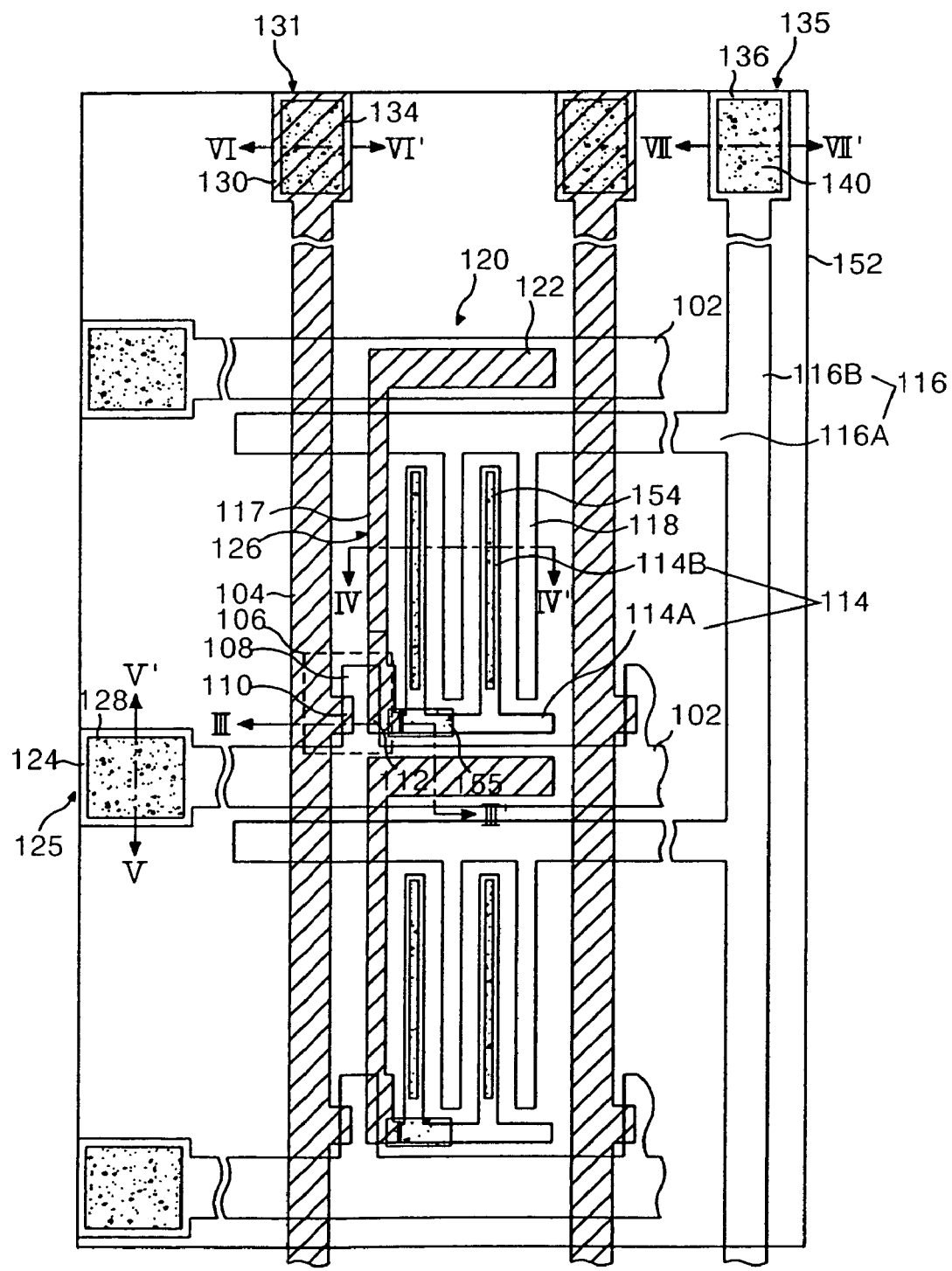
FIG. 4 is a plan view showing a structure of a thin film transistor substrate of a horizontal electric field type LCD according to a first exemplary embodiment of the present invention.

Hereinafter, the preferred embodiments of the present invention will be described in detail with reference to FIGS. 4 to 14. FIG. 4 is a plan view showing a structure of a thin film transistor substrate for a horizontal electric field type LCD according to a first embodiment of the present invention, and FIG. 5 is a cross-sectional view of the thin film transistor substrate taken along lines III-III', IV-IV', V-V', VI-VI' and VII-VII' of FIG. 4.

Figure 5:
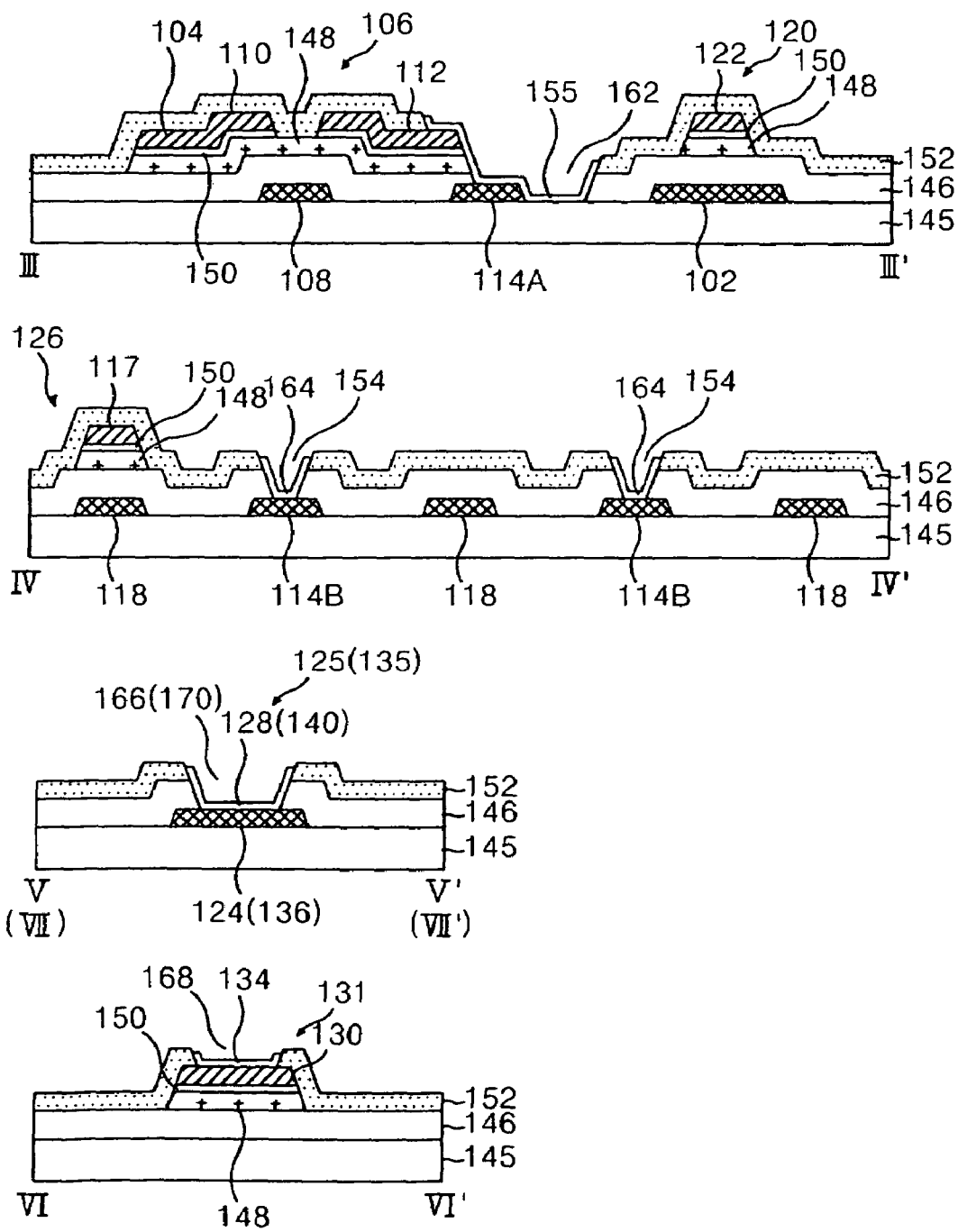
FIG. 5 is a cross-sectional view of the thin film transistor substrate taken along lines III-III', IV-IV', V-V', VI-VI' and VII-VII' of FIG. 4.

Referring to FIG. 4 and FIG. 5, the thin film transistor substrate includes a gate line 102 and a data line 104 provided on a lower substrate 145 intersecting each other and having a gate insulating film 146 therebetween, a thin film transistor 106 provided at an intersection of the gate line 102 and the data line 104, a pixel electrode 114 and a common electrode 118 provided at a pixel area defined by an intersection structure for forming a horizontal electric field, and a common line 116 connected to the common electrode 118. Furthermore, the thin film transistor substrate includes an upper storage electrode 122, a gate pad 125 connected to the gate line 102, a data pad 131 connected to the data line 104, a common pad 135 connected to the common line 116, and first and second storage capacitors 120 and 126 overlap a portion of the gate line 102 and the common electrode 118.

The gate line 102 which is supplied with a gate signal and the data line 104 which is supplied with a data signal are provided in an intersection structure to defined a pixel area. The common line 116 and the common electrode 118 supply a reference voltage to drive the liquid crystal material. The common line 116 includes an internal common line 116A provided in parallel with the gate line 102 at a display area, and an external common line 116B commonly connected to the internal common line 116A at a non-display area. The common electrode 118 has a extended portion that is extended from the internal common line 116A into the pixel area.

The thin film transistor 106 allows the pixel signal from the data line 104 to be charged at the pixel electrode 114 and be maintained. The thin film transistor 106 includes a gate electrode 108 connected to the gate line 102, a source electrode 110 connected to the data line 104, a drain electrode 112 connected to the pixel electrode 114, an active layer 148 overlapping the gate electrode 108 and having a gate insulating film 146 therebetween to define a channel portion between the source electrode 110 and the drain electrode 112, and an ohmic contact layer 150 disposed on the active layer 148 disposed other portions of the thin film transistor 106 makes an ohmic contact with the source electrode 110 and the drain electrode 112. Furthermore, both the active layer 148 and the ohmic contact layer 150 overlaps the data line 104, a lower data pad electrode 130, first upper storage electrode 122 and second upper storage electrode 117. The source electrode 110, the drain electrode 112, the data line 104, a lower data pad electrode 130, and first and second upper storage electrode 122 and 117 forms a source/drain metal group.

In the FIG. 4 and FIG. 5, a gate metal pattern group includes the pixel electrode 114, the common electrode 118, the gate electrode 108, the gate line 102, the common line 116, a lower common pad electrode 136, and a lower gate pad electrode 124. The pixel electrode 114 forms a horizontal electric field to the drain electrode 112 of the thin film transistor 106 via a contact electrode 155. The contact electrode 155 is provided within the contact hole 162 to connect the pixel electrode 114, the common electrode 118, the common line 116, and the gate line 102, to the drain electrode 112. More specifically, the pixel electrode includes a horizontal part 104A and a extended portion 114B. The horizontal part is connected to the drain electrode 112 via the contact electrode 155. The horizontal part 114A is disposed in parallel with the gate line 102, and the extended portion 114B which extends from the horizontal part 114A into the pixel area is disposed in parallel with the extended portion of the common electrode 118. Thus, a horizontal electric field is formed between the extended portion of the pixel electrode 114 and the extended portion of the common electrode 118. A pixel signal is applied to the pixel electrode 118 via the thin film transistor 106 and a reference voltage is applied to the common electrode 118 via the common line 116. Liquid crystal material arranged in the horizontal direction between the thin film transistor substrate and the color filter substrate rotates due to a dielectric anisotropy from a horizontal electric field. Transmittance of light to the pixel area is varied depending upon a rotation extent of the liquid crystal material, thereby implementing a gray level scale.

The storage capacitor includes the first and second storage capacitors 120 and 126 connected continuously with each other thereby increasing a capacitance level. The first storage capacitor 120 includes a portion of the gate line 102 forming a first lower storage electrode, a first upper storage electrode 122 overlapping the first lower storage electrode and insulating each other by disposing the gate insulating film 146, the active layer 148 and the ohmic contact layer 150 therebetween. The second storage capacitor 126 includes portions of an internal common line 116A, a portion of the common electrode 118 forming a second lower storage electrode, an upper storage electrode 122 overlapping the second lower storage electrode and insulating each other by disposing the gate insulating film 146, the active layer 148 and the ohmic contact layer 150 are disposed therebetween. The second upper storage electrode 117 is integrated with the first upper storage electrode 122 and the drain electrode 112. More specifically, the second upper storage electrode 117 is extended from the first upper storage electrode 122 into the pixel area to overlap with the first common electrode 118 across the internal common line 116A, and is integrated with the drain electrode 112. As mentioned above, the storage capacitor has a structure that allows a stable maintenance of pixel signal charged in the pixel electrode 114 until the next pixel signal is charged.

The gate line 102 is connected to a gate driver (not shown) via the gate pad 125. The gate pad 125 includes a lower gate pad electrode 124 extended from the gate line 102, and an upper gate pad electrode 128. The upper gate pad electrode 128 is connected to the lower gate pad electrode 124 via a first contact hole 166 which passes through the gate insulating film 146 and the protective film 152. The common line 116 receives a reference voltage from an external reference voltage source (not shown) through the common pad 135. The common pad 135 includes a lower common pad electrode 136 extended from the common line 116, and an upper common pad electrode 140. The upper common pad electrode 140 is connected to the lower common pad electrode 136 via a second contact hole 170 going through the gate insulating film 146 and the protective film 152. The data line 104 is connected to the data driver (not shown) via the data pad 131. The data pad 131 includes a lower data pad electrode 130 extended from the data line 104 and an upper data pad electrode 134. The upper data pad electrode 134 is connected to the lower data pad electrode 130 via a third contact hole 168 passing through the protective film 152.

In such a thin film transistor substrate, a transparent conductive pattern group includes the contact electrode 155, the upper gate pad electrode 128, the upper data pad electrode 134, and the upper common pad electrode 140, and all are formed from a transparent conductive film 172. The transparent conductive pattern group is formed by a lift-off process which removes a photo-resist pattern 160 used to pattern the protective film 152 and the gate insulating film 146, and the transparent conductive pattern group makes an interface with the protective film 152. The thin film transistor substrate according to the first embodiment of the present invention can eliminate patterning process to pattern the transparent conductive film 172 by such an application of the lift-off process, thus reducing the total number of mask process. In addition, to enhance lift-off ability, first to fourth contact holes and a plurality of stripper penetration paths 154 passing through either the gate insulating film 146 and the protective film 152 or the protective film 152 alone on the above-mentioned signal lines and electrodes, are further provided. For instance, the plurality of stripper penetration path 154 are provided on the extended portion 114B of the pixel electrode 114 or the extended portion of the common electrode 118. Such stripper penetration path 154 is provided at a portion having no photo-resist pattern on the substrate thereby easily saturate a stripper into the interface portion, so that the stripper penetration path 154 can enhance lift-off ability of the photo-resist pattern 160.

A method of fabricating the thin film transistor substrate according to the first exemplary embodiment of the present invention having advantage of one less mask process will be described in detail below.

Figure 6A:
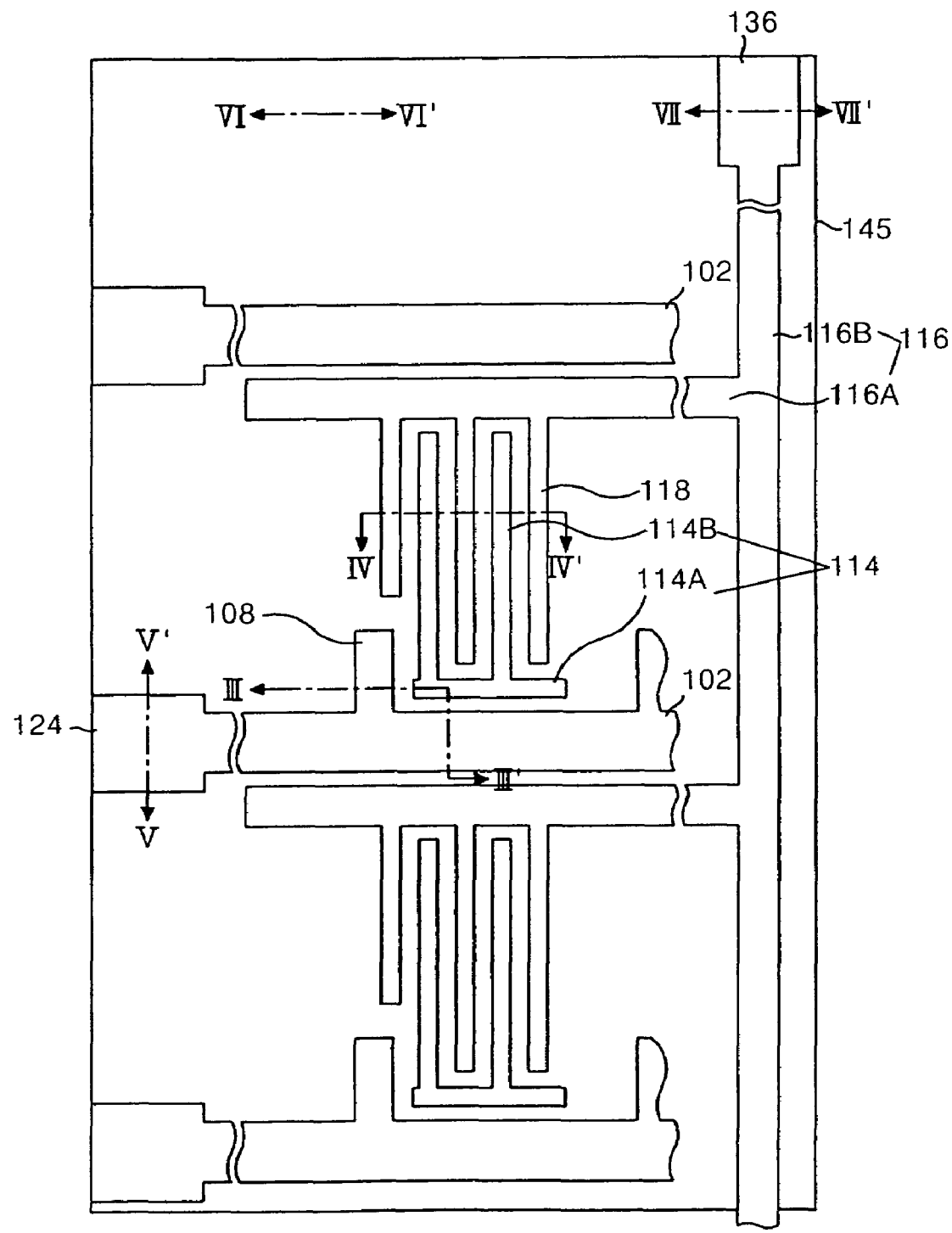
FIG. 6A and FIG. 6B are a plan view and a cross-sectional view for explaining a first mask process in a method of fabricating the thin film transistor substrate according to the first exemplary embodiment of the present invention.
Figure 6B:
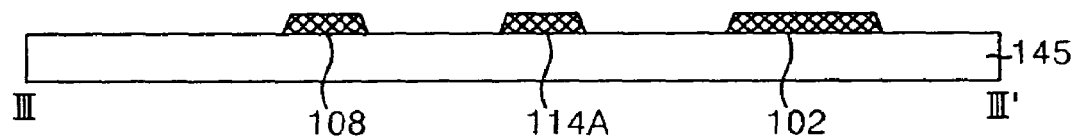
Figure 6B:
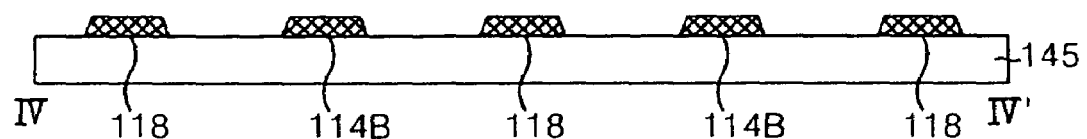
Figure 6B:
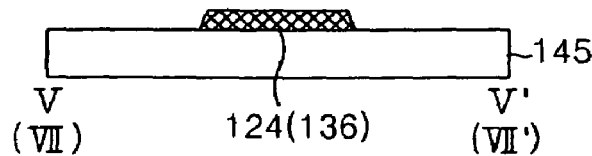
Figure 6B:
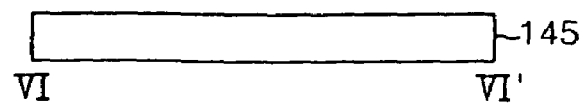

FIG. 6A and FIG. 6B are a plan view and a cross-sectional view for explaining a first mask process according to the first embodiment of the present invention. As shown in FIG. 6A and FIG. 6B, a gate metal pattern group including the pixel electrode 114, the gate line 102, the gate electrode 108, the lower gate pad electrode 124, the common line 116, the common electrode 118, and the lower common pad electrode 136 are disposed on the lower substrate 145 by the first mask process.

More specifically, a gate metal layer is formed on the lower substrate 145 by a deposition technique such as sputtering. Then, the gate metal layer is patterned by photolithography and etching processes using a first mask to form the gate metal pattern group. The gate metal layer is formed from Cr, MoW, Cr/Al, Cu, Al(Nd), Mo/Al, Mo/Al(Nd) or Cr/Al(Nd), or other suitable material.

Figure 7A:
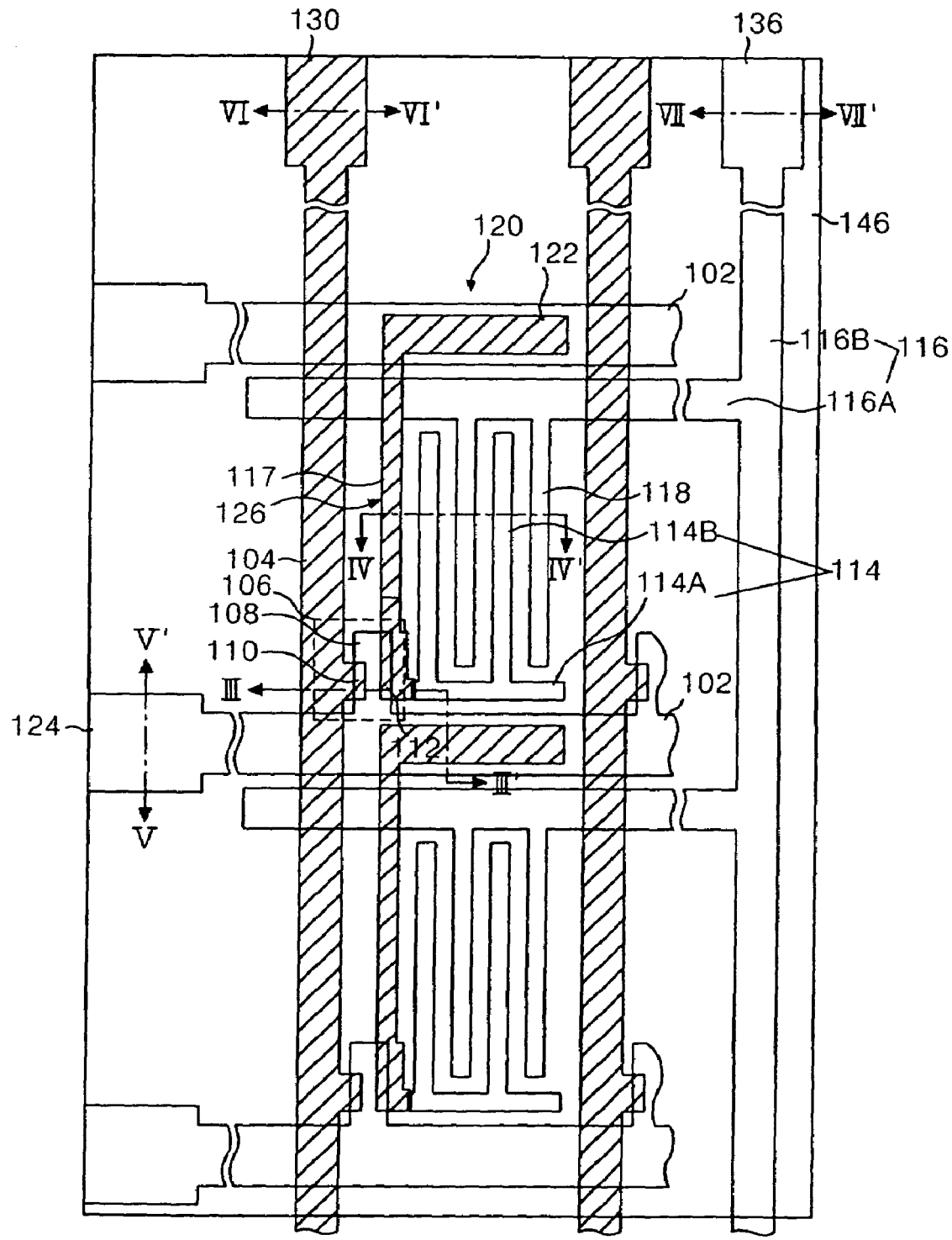
FIG. 7A and FIG. 7B are a plan view and a cross-sectional view for explaining a second mask process in a fabricating method of the thin film transistor substrate according to the first exemplary embodiment of the present invention.
Figure 7B:
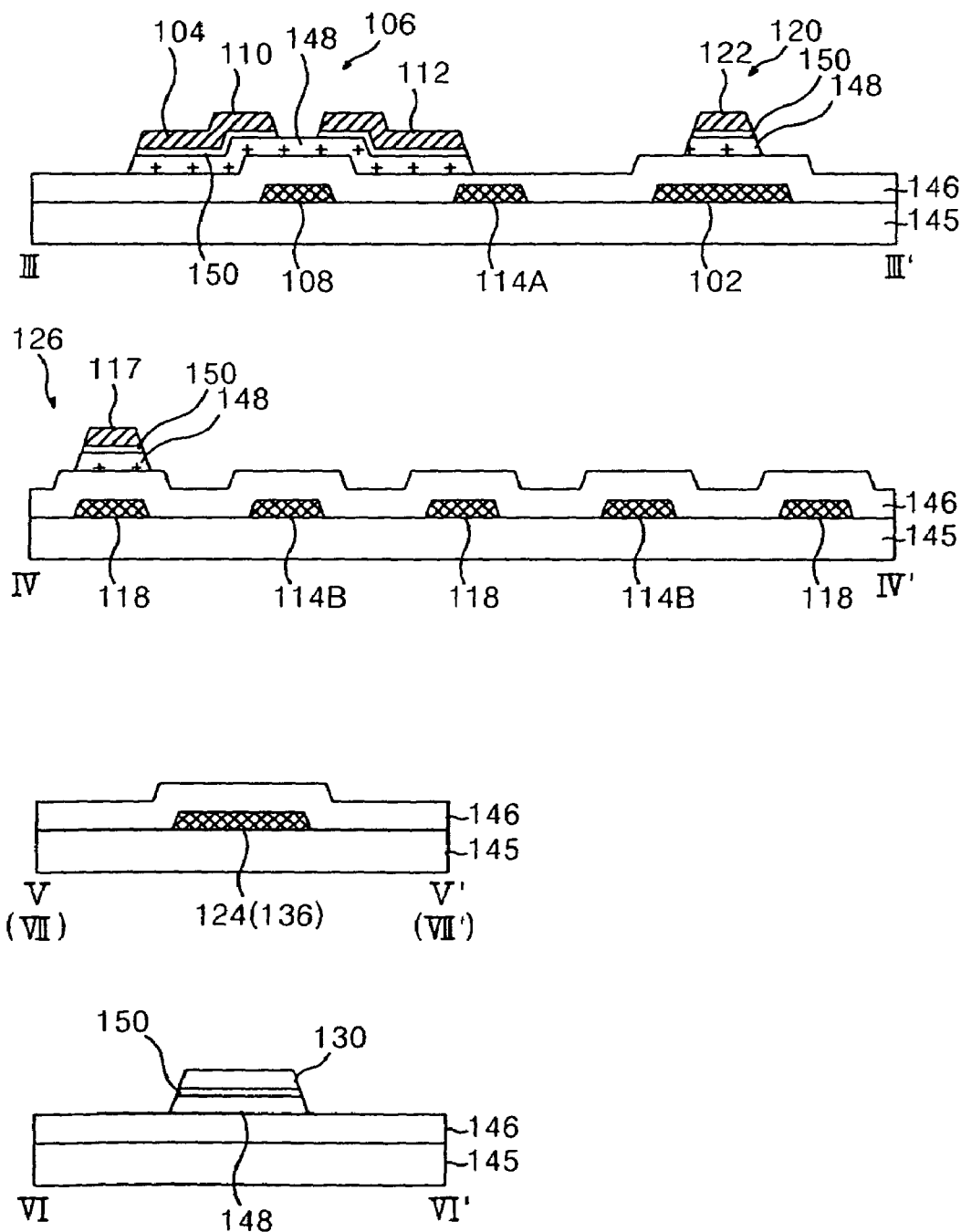

FIG. 7A and FIG. 7B are a plan view and a cross-sectional view for explaining a second mask process according to the first embodiment of the present invention. FIG. 8A to FIG. 8D are cross-sectional views for explaining the second mask process in detail. Firstly, the gate insulating film 146 is formed on the lower substrate 145 which is provided with the gate metal pattern group by deposition techniques such as plasma enhanced chemical vapor deposition (PECVD), sputtering and the like. The gate insulating film 146 is formed from an inorganic insulating material such as silicon nitride ($SiN_x$) or silicon oxide ($SiO_x$). As shown in FIG. 7A and FIG. 7B, a semiconductor pattern including the active layer 148 and the ohmic contact layer 150 are disposed on the gate insulating film 146. A source/drain metal pattern group including the data line 104, the source electrode 110, the drain electrode 112, the lower data pad electrode 130, and the first and second upper storage electrodes 122 and 117 are formed on the lower substrate which is provide with the gate insulating film 146. Both the semiconductor pattern and the source/drain metal pattern group are disposed by the second mask process.

Figure 8A:
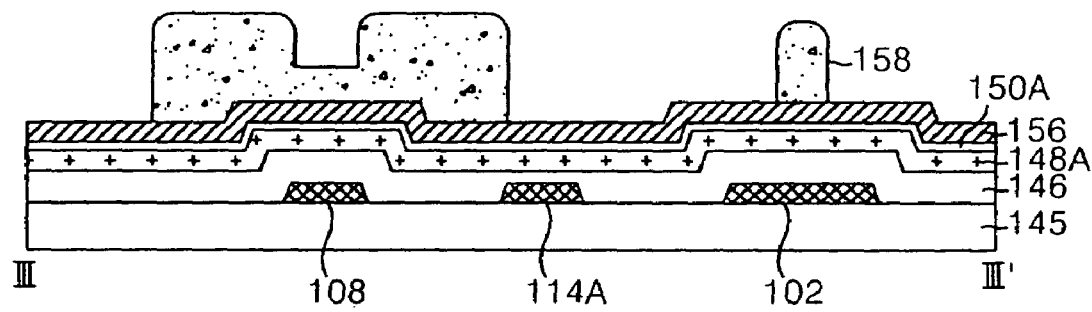
FIG. 8A to FIG. 8D are cross-sectional views for a detailed explanation of the second mask process in a method of fabricating the thin film transistor substrate according to the first exemplary embodiment of the present invention.
Figure 8A:
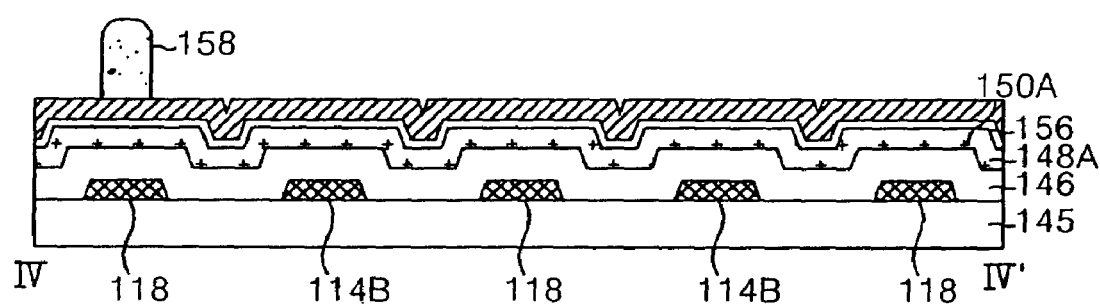
Figure 8A:
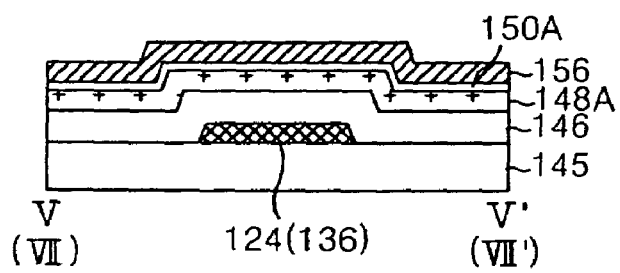
Figure 8A:
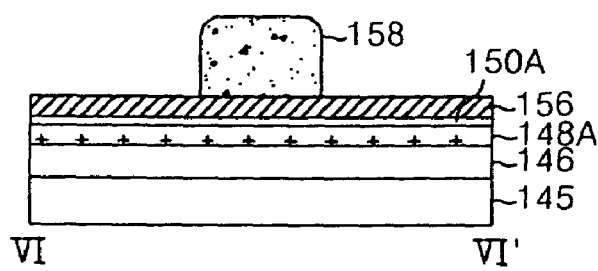

More specifically, as shown in FIG. 8A, an amorphous silicon layer 148A (i.e., active layer 148), an n⁺ amorphous silicon layer 150A (i.e., ohmic contact layer 150), and the source/drain metal layer 156 are sequentially disposed on the gate insulating film 146 by deposition techniques such as plasma enhanced chemical vapor deposition (PECVD) and sputtering, or other suitable technique. The source/drain metal layer 156 is formed from Cr, MoW, Cr/Al, Cu, Al(Nd), Mo/Al, Mo/Al(Nd) or Cr/Al(Nd), or other suitable material.

Figure 8B:
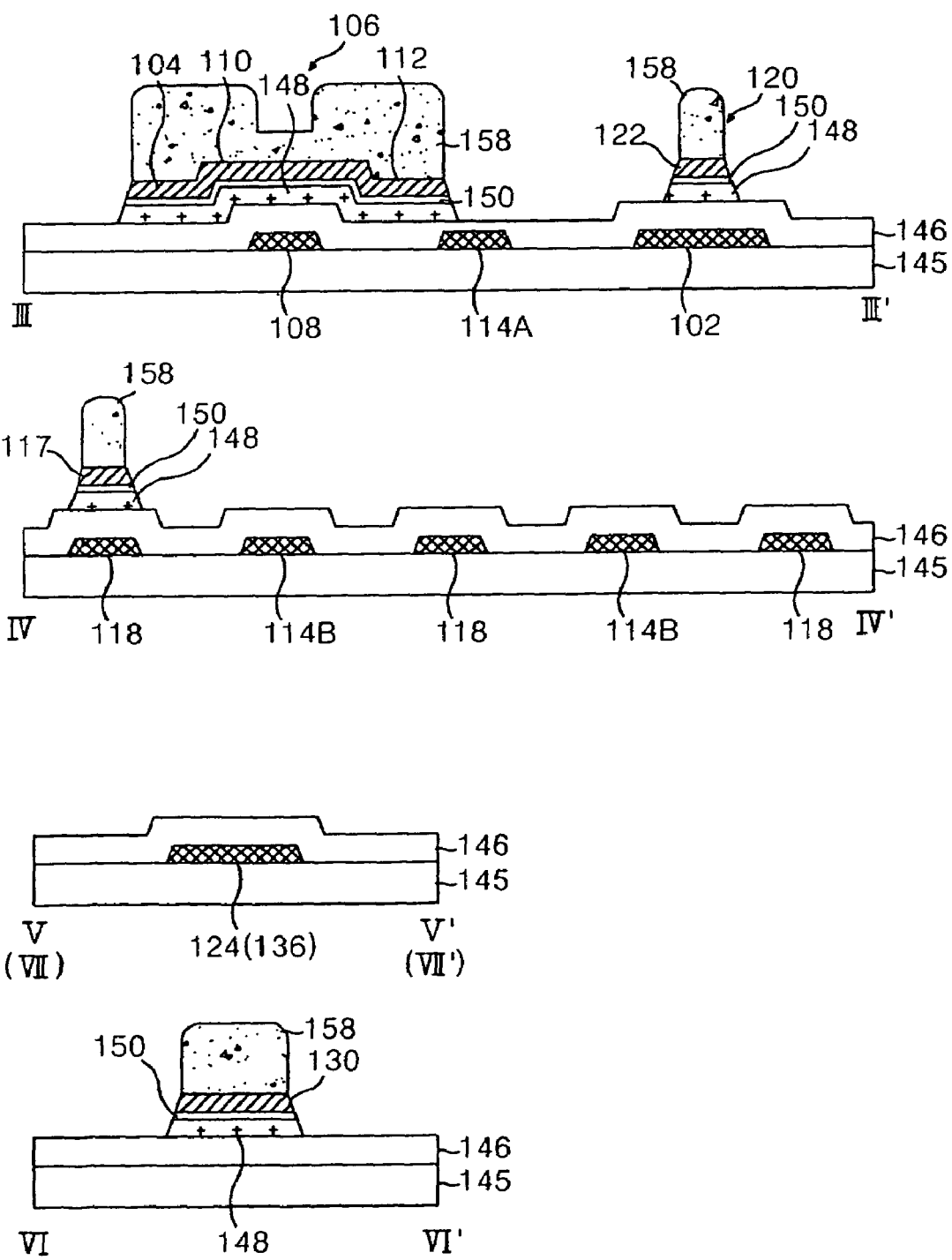

Next, a photo-resist film is coated onto the source/drain metal layer 156 and then a photo-resist pattern 158 having step coverage as shown in FIG. 8A is formed thereon by photolithography. The photo-resist pattern 158 is also formed by the second mask that is a partial-exposure mask. In the first embodiment of the present invention, a partial-exposure mask having a diffractive exposing part (or a semi-transmitting or transflective part) at a portion where a channel of the thin film transistor forms is used. Accordingly, the photo-resist pattern 158 corresponds to the diffractive exposing part (or the semi-transmitting part) has a lower height than the a transmitting part (or a shielding part). In other words, the photo-resist pattern 158 disposed at the channel portion has a lower height than the other portions where the photo-resist pattern 158 is disposed on the source/drain metal pattern group. Subsequently, as shown in FIG. 8B, the source/drain metal layer 156 is patterned by a wet etching process using the photo-resist pattern 158 to provide the source/drain metal pattern group. The first upper storage electrode 122 overlaps a portion of the gate line 102 where the gate line 102 forming the first lower storage electrode, whereas the second upper storage electrode 117 overlaps the common electrode 118 across the internal common line 116A. The second upper storage electrode is integrated with the drain electrode 112 and the first upper storage electrode 122.

Figure 8C:
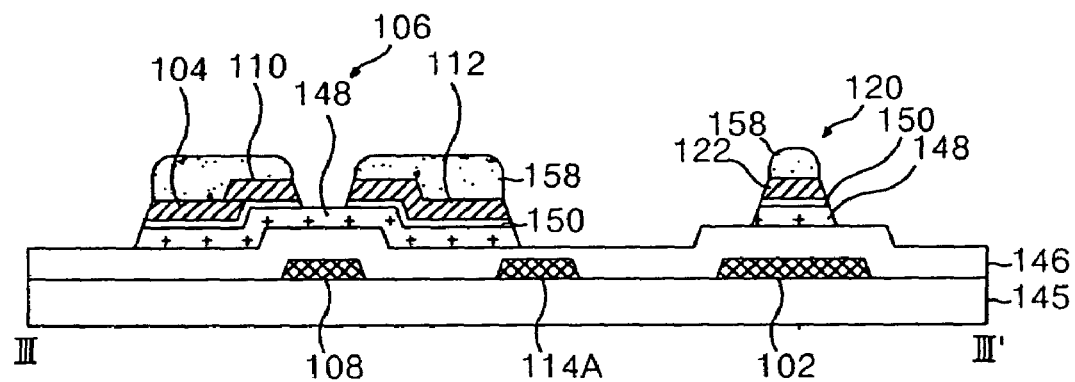
Figure 8C:
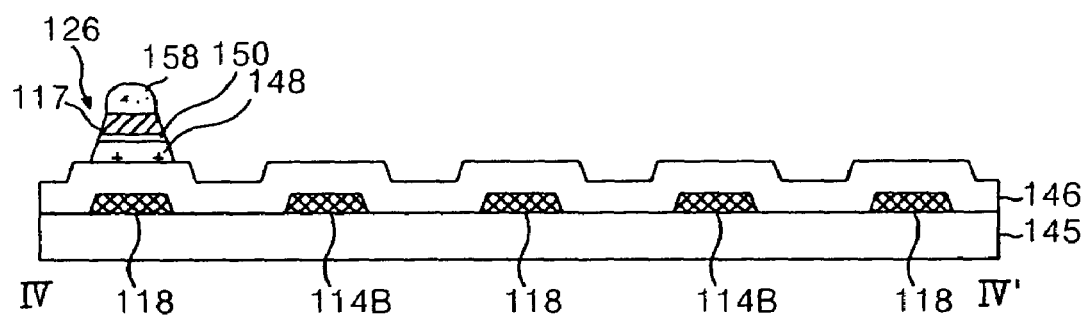
Figure 8C:
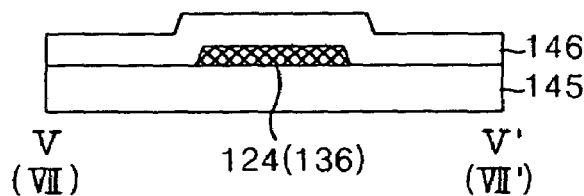
Figure 8C:
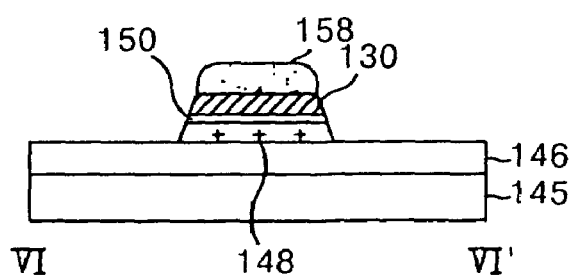
Figure 8D:
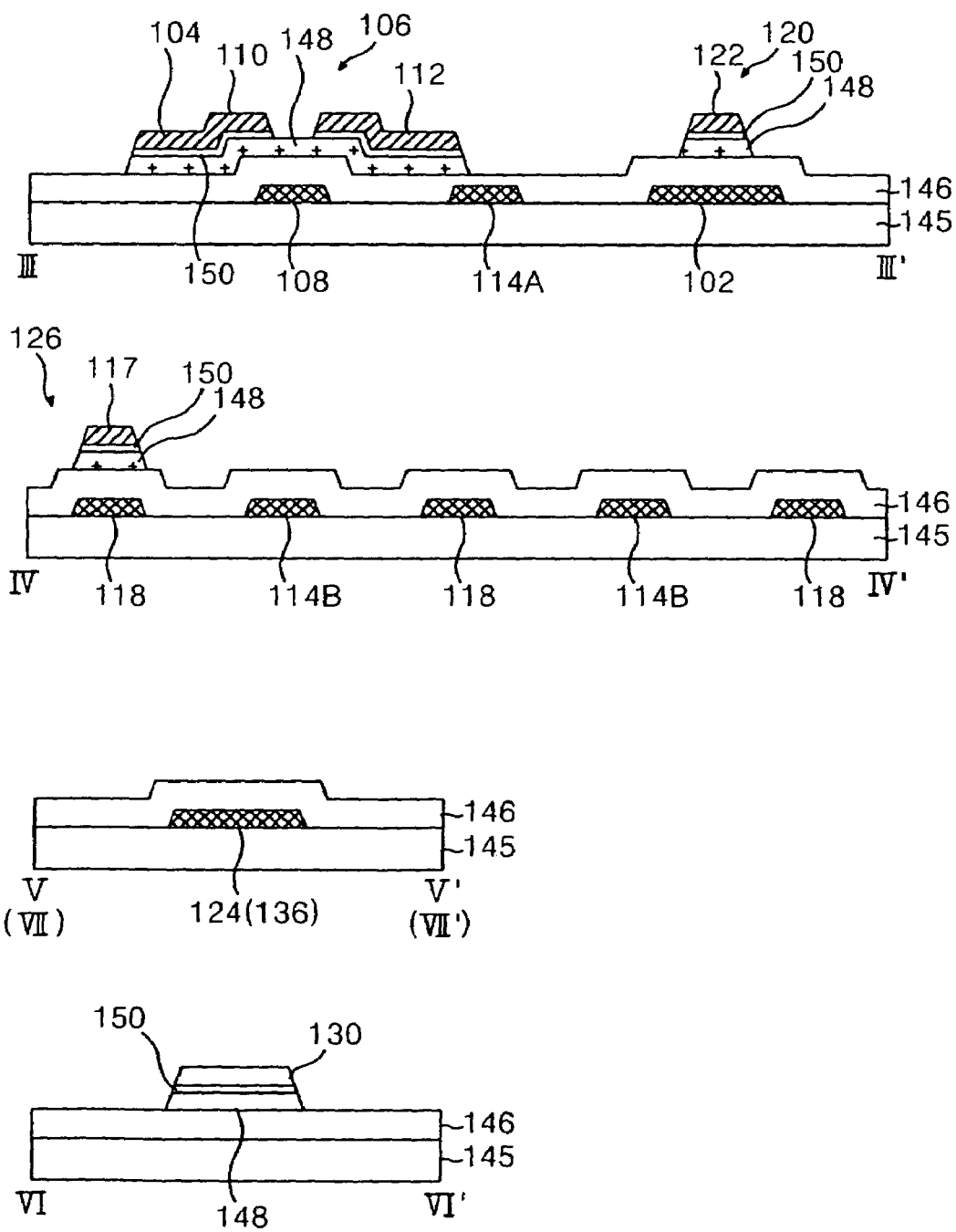

Next, as shown in FIG. 8C, the photo-resist pattern 158 disposed at the channel portion having a relatively low height is removed by ashing process using oxygen ($O_2$) plasma while the other portion of photo-resist pattern 158 disposed on the source/drain metal pattern group is preserved. Then source/drain metal layer 156 and the ohmic contact layer 150 disposed at the channel portion are etched by the dry etching process using the photo-resist pattern 158. Thus, a channel is formed between the source electrode 110 and the drain electrode 112 disconnecting each other and exposing the active layer 148. FIG. 8D shows the stripping process removing the entire portion of the photo-resist pattern 158 preserved on the source/drain metal pattern group.

Figure 9A:
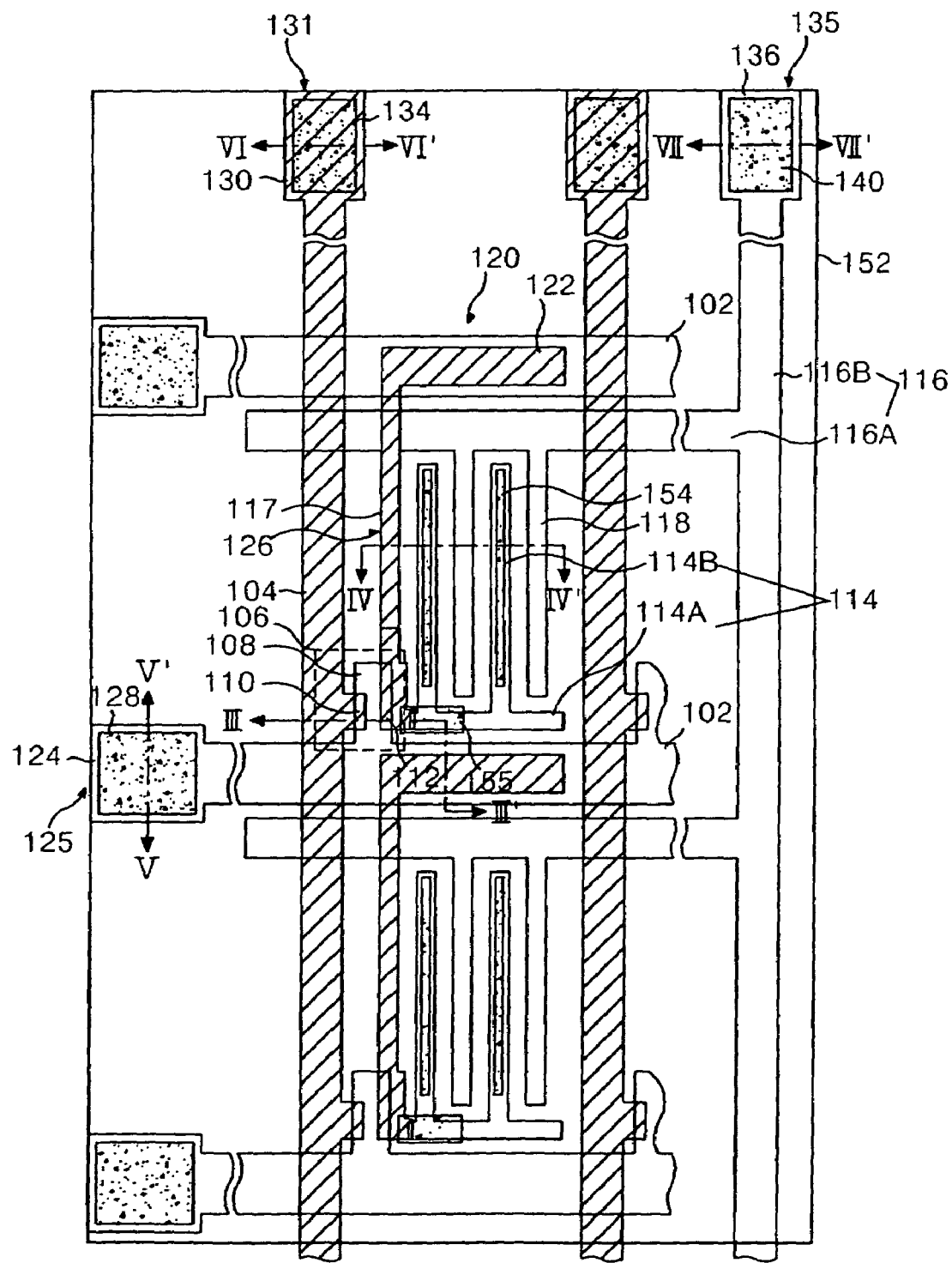
FIG. 9A and FIG. 9B are a plan view and a cross-sectional view for explaining a third mask process in a method of fabricating the thin film transistor substrate according to the first exemplary embodiment of the present invention.
Figure 9B:
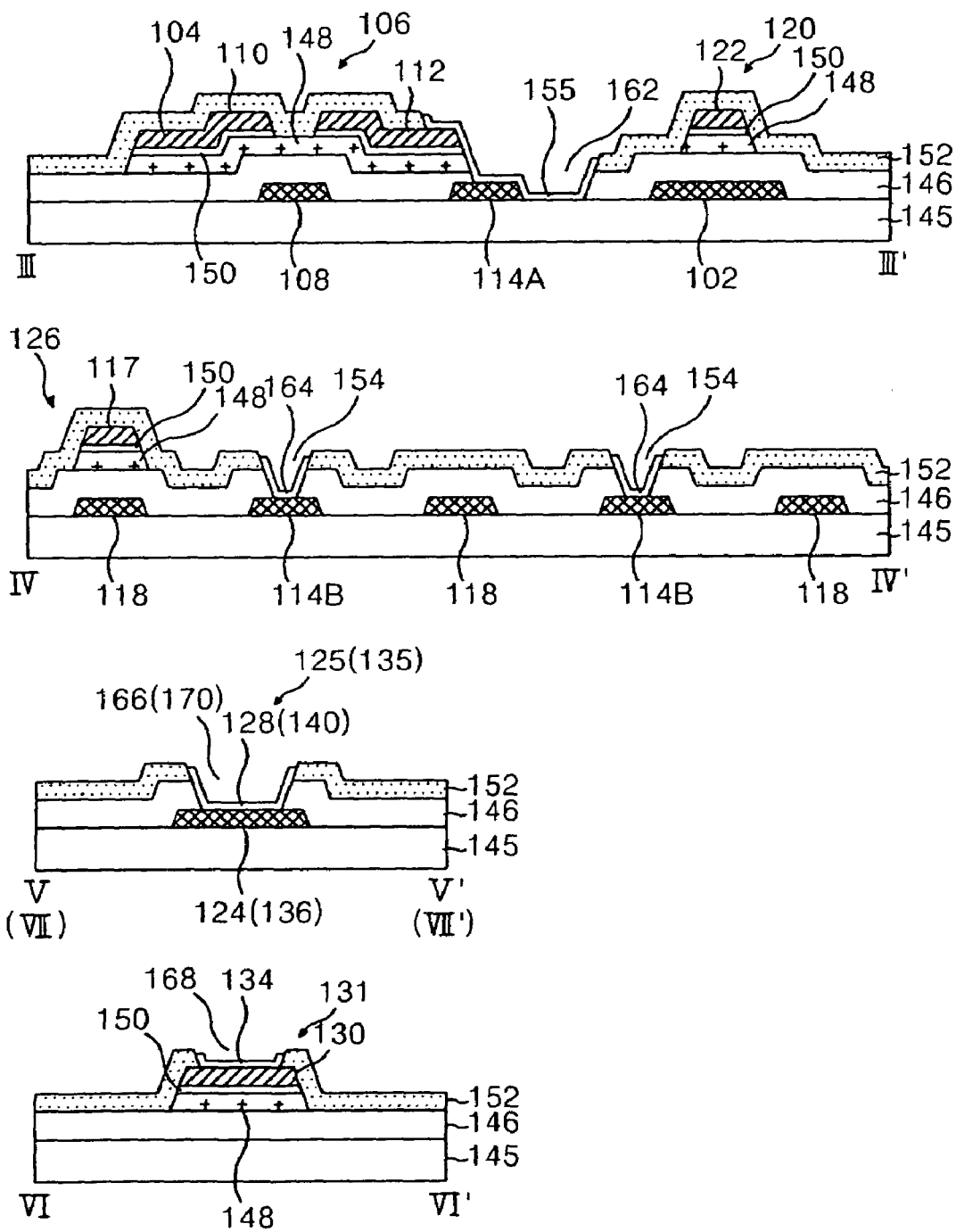

FIG. 9A and FIG. 9B are a plan view and a cross-sectional view for explaining a third mask process according to the first embodiment of the present invention, respectively. FIG. 10A to FIG. 10D are cross-sectional views for explaining the third mask process in detail. As shown in FIG. 9A and FIG. 9B, a protective film 152 is disposed on the gate insulating film 146 then both are patterned by the third mask process. Subsequently, the transparent conductive pattern group including the contact electrode 155, the upper gate pad electrode 128, the upper data pad electrode 134, the upper common pad electrode 140 and a dummy transparent conductive pattern 164 are formed. The transparent conductive pattern group makes an interface with the patterned protective film 152 without any overlapped portion.

Figure 10A:
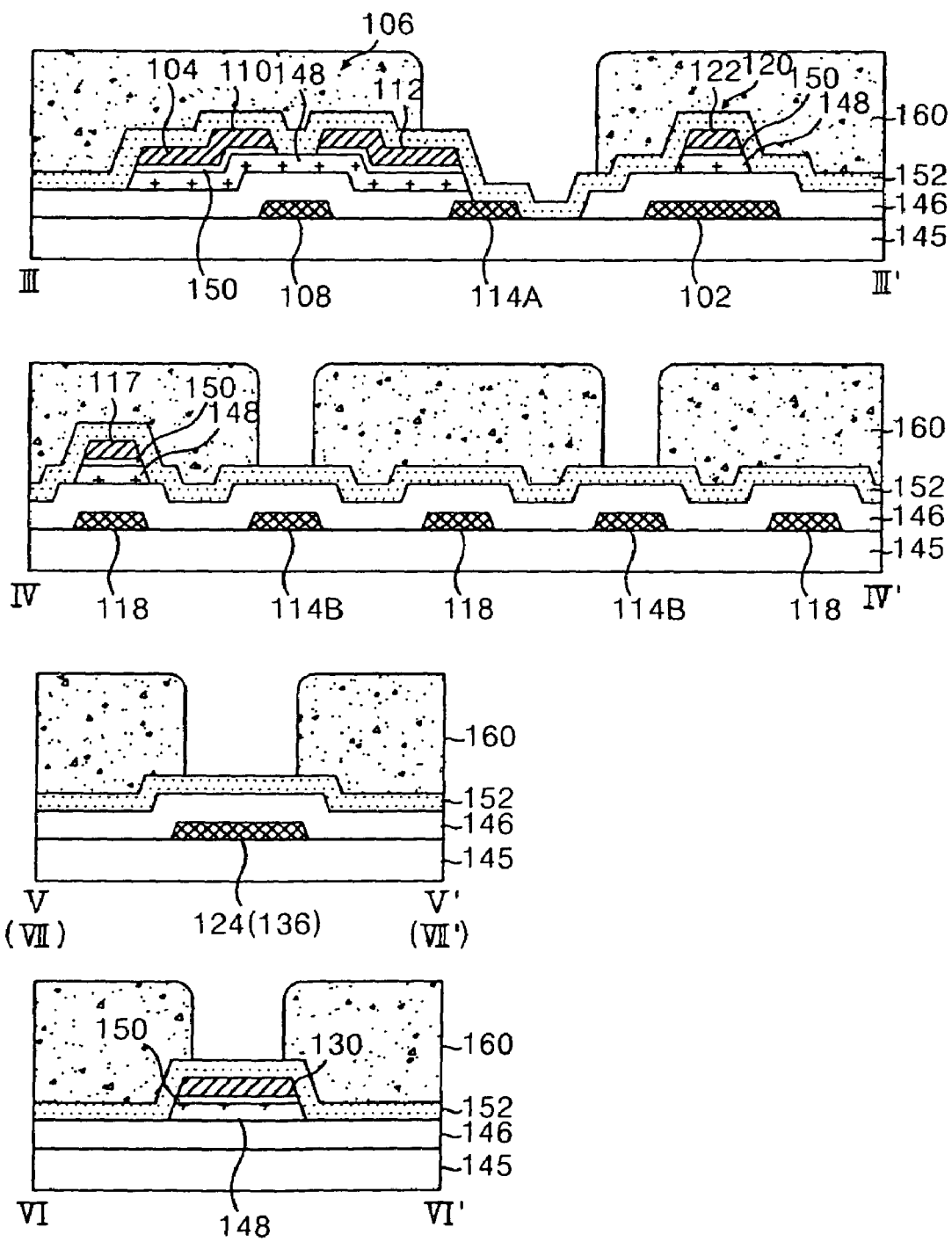
FIG. 10A to FIG. 10D are cross-sectional views for a detailed explanation of the third mask process in a method of fabricating the thin film transistor substrate according to the first exemplary embodiment of the present invention.

More specifically, as shown in FIG. 10A, the protective film 152 is formed on the gate insulating film 146 which is already provided with the source/drain metal pattern group. The protective film 152 is formed from an inorganic insulating material or an organic insulating material similar to that of the gate insulating film 146. Furthermore, a photo-resist pattern 160 is formed at a portion where the protective film 152 needs to be preserved. The photo-resist pattern 160 is formed by the photolithography using a third mask.

Figure 10B:
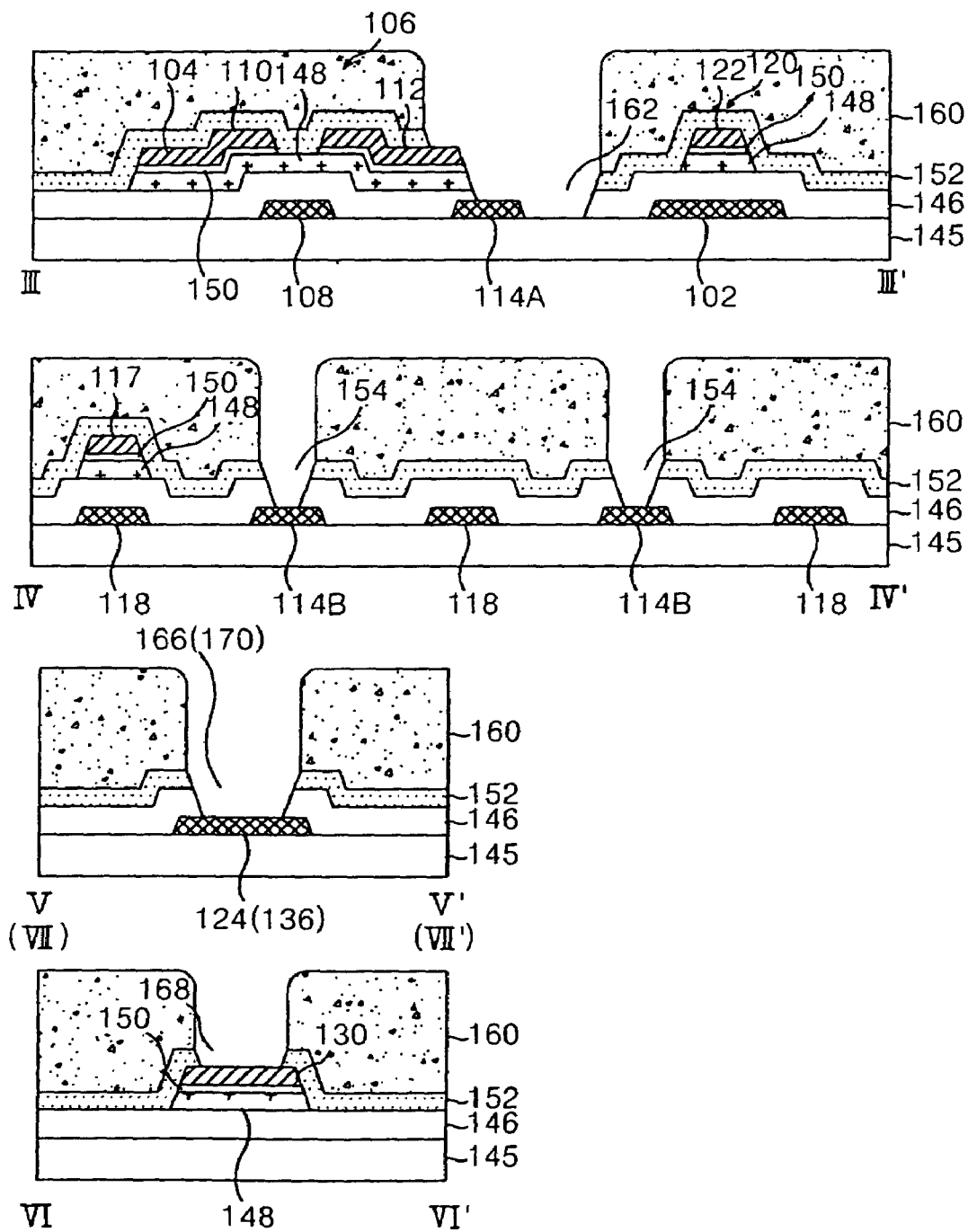

Next, as shown in FIG. 10B, the protective film 152 and the gate insulating film 146 are patterned by dry etching process using the photo-resist pattern 160 to provide first to fourth contact holes 166, 170, 168 and 162, and a plurality of stripper penetration paths 154. The first contact hole 166 exposes the lower gate pad electrode 124; the second contact hole 170 exposes the lower common pad electrode 136; the third contact hole 168 exposes the lower data pad electrode 130; and the fourth contact hole 162 exposes a portion of the drain electrode 112 and a portion of the horizontal part 114A of the pixel electrode 114. Furthermore, the stripper penetration paths 154 exposes the extended portion 114B of the pixel electrode 114 or the common electrode 118.

Figure 10C:
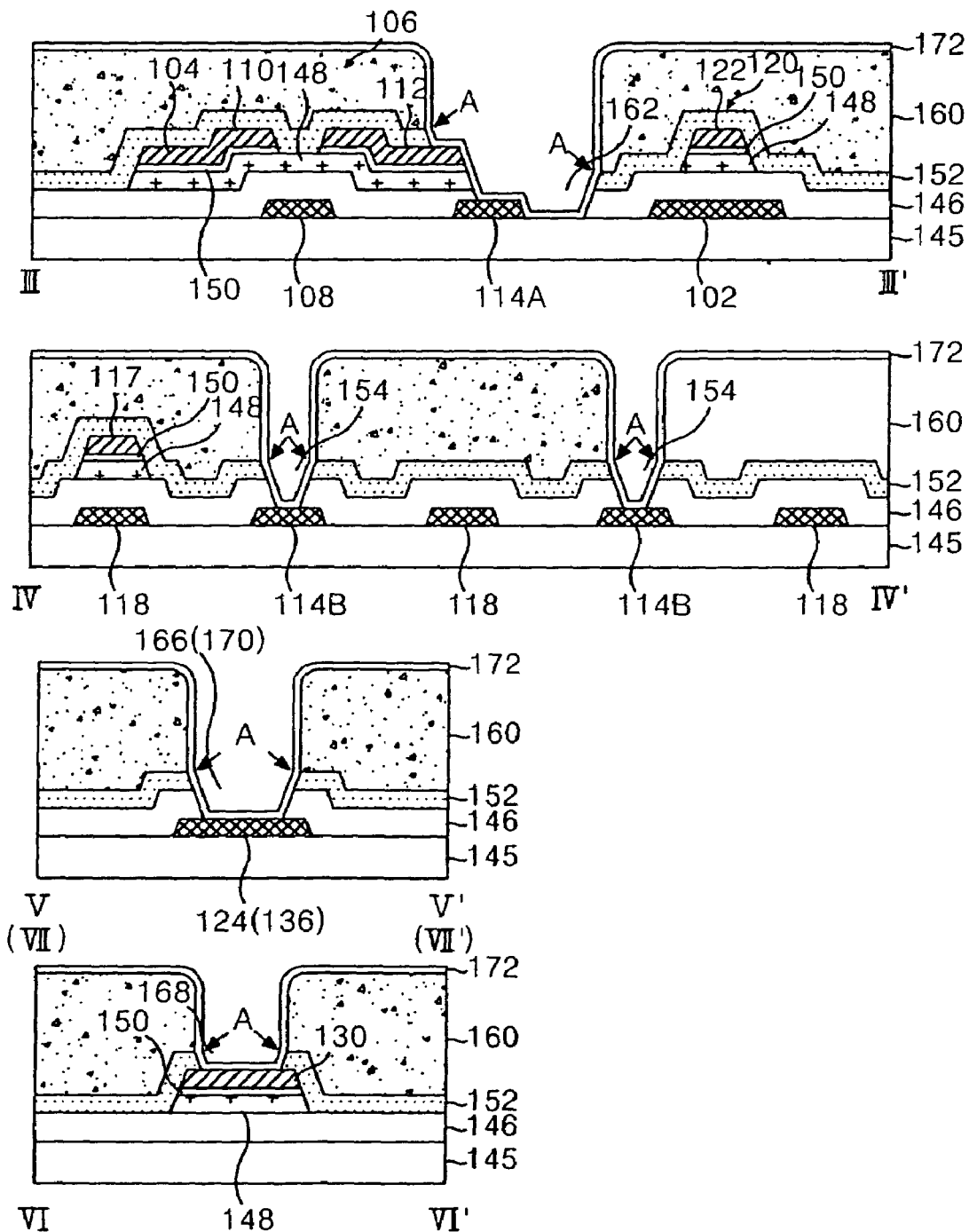
Figure 10D:
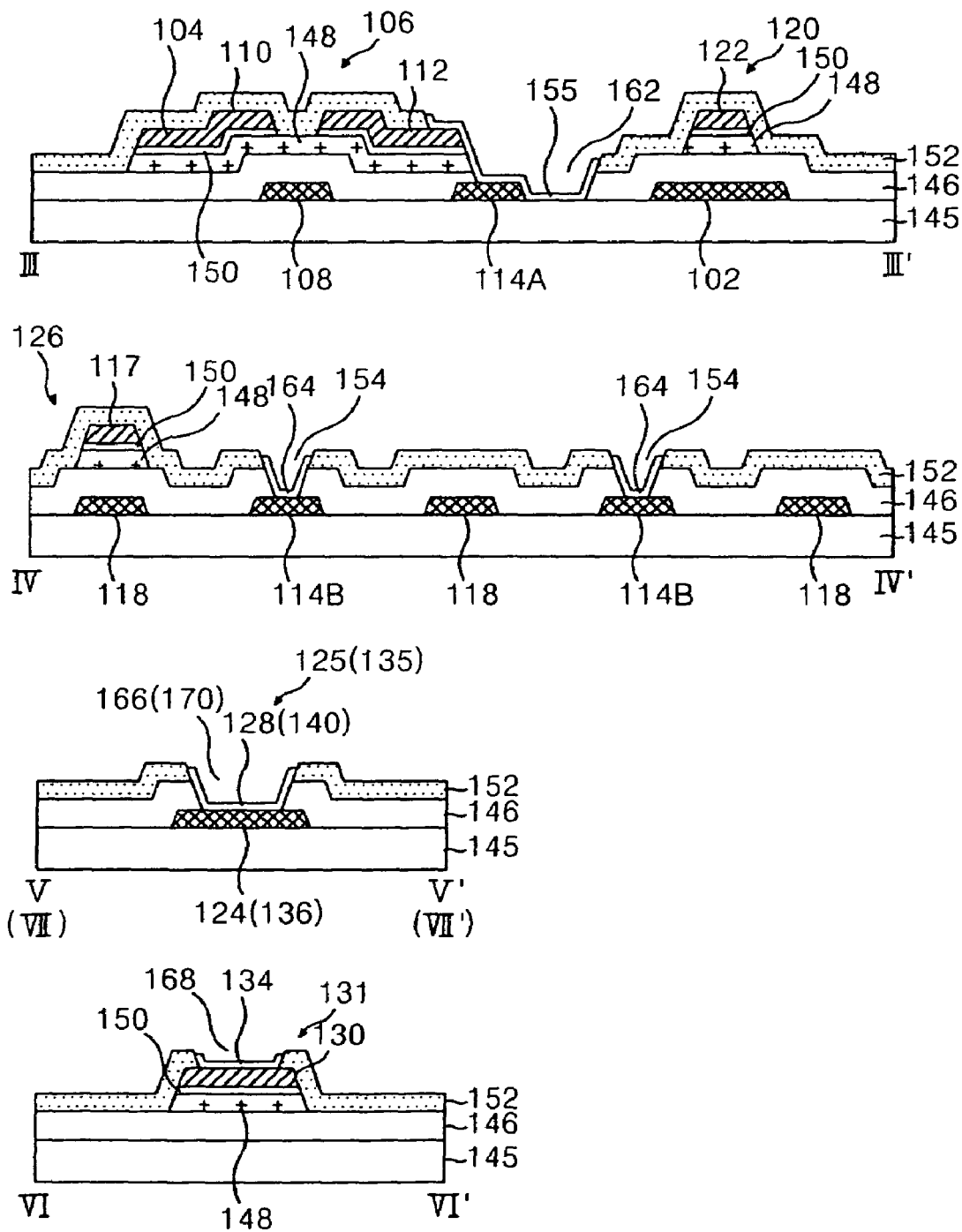
Figure 11A:
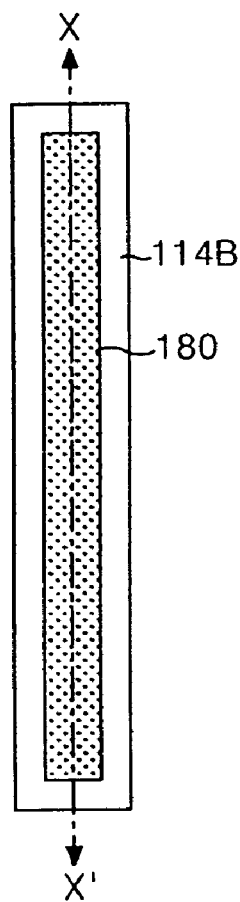
FIG. 11A and FIG. 11B are a plan view and a cross-sectional view showing first example of a stripper penetration path applied to the thin film transistor substrate.
Figure 11B:
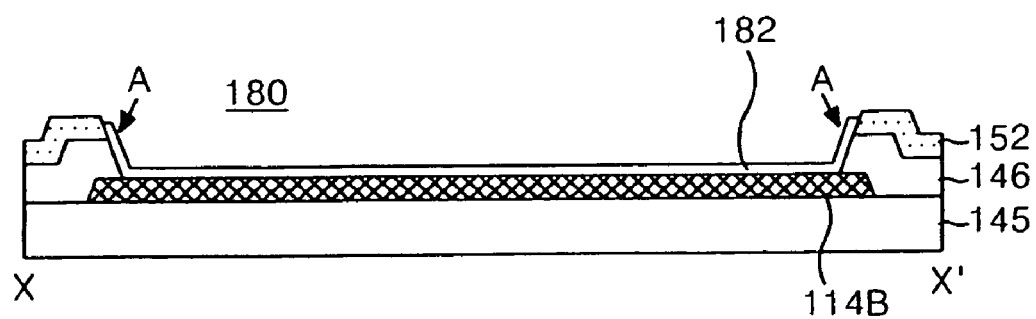

Next, as shown in FIG. 10C, a transparent conductive film 172 is formed on the thin film transistor substrate which is provided with the photo-resist pattern 160. The transparent conductive film 172 is disposed by a deposition technique such as sputtering and the like, and is formed from a transparent conductive layer containing indium-tin-oxide (ITO), tin-oxide (TO), indium-zinc-oxide (IZO) or $SnO_2$, or other suitable material. As shown in FIG. 10D, the photo-resist pattern 160 and the transparent conductive film 172 thereon, are removed by the lift-off process to provide the transparent conductive pattern group at each of the first to fourth contact holes 166, 170, 168 and 162 and the plurality of stripper penetration paths 154, respectively.

The first to fourth contact holes 162, 166, 170 and 168, and the plurality of stripper penetration paths 154, allows a greater amount of stripper A of FIG. 10C to be infiltrated into the interface portions where the photo-resist pattern 160 and the protective film 152 are absent. The stripper A allows easy separation of the photo-resist pattern 160 and the transparent conductive film layer 172 from the protective film 152. This is caused by a fact that the edge of the photo-resist pattern 160 has a more protruded shape (not shown) than the edge of the protective film 152 at a the plurality of stripper penetration paths 154 and the first to fourth contact holes 162, 166, 170 and 162. Furthermore, this is because the transparent conductive film 172 is deposited linearly at the edge portion of the photo-resist pattern 160 and the edge portion of the protective film 152, or is relatively thinly deposited by the protruded edge of the photo-resist pattern 160.

As mentioned above, an unnecessary portion of the transparent conductive film 172 and the photo-resist pattern 160 are removed by lift-off process, so that the transparent conductive pattern group makes an interface with the protective film 152 at side surfaces and is absent from the upper surface of the protective film 152. More specifically, the upper gate pad electrode 128, the upper common pad electrode 140 and the upper data pad electrode 134 makes an interface with the protective film 152 within the respective contact holes 166, 170 and 168 so that they are connected to the lower gate pad electrode 124, the lower common pad electrode 136, and the lower data pad electrode 130, respectively. The contact electrode 155 makes an interface with the protective film 152 within the fourth contact hole 162 to connect the drain electrode 112 to the horizontal part 114A of the pixel electrode 114. Furthermore, a plurality of dummy transparent conductive pattern 164 also makes an interface with the protective film 152 within the plurality of stripper penetration path 154.

Examples of a shape of the stripper penetration paths 154 provided on the extended portion 114B of the pixel electrode 114 or the extended portion of the common electrode 118 will be described next. The first example is described referring to FIG. 11A and FIG. 11B. The stripper penetration path 154 is formed on the extended portion 114B of the pixel electrode 114 by a straight-shaped slit 180 passing through the gate insulating film 146 and the protective film 152. Furthermore, the dummy transparent conductive pattern 182 is disposed on the straight-shaped slit 180. The straight-shaped slit 180 may be provided on any one of a plurality of signal lines and electrodes including the gate line 102, the common line 116, the data line 104, the pixel electrode 114, and a portion of the drain electrode 112.

Figure 12A:
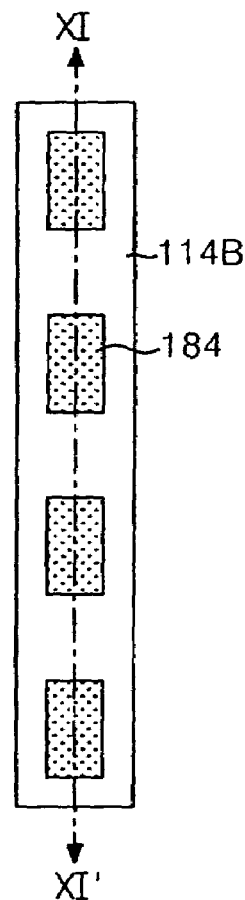
FIG. 12A and FIG. 12B are a plan view and a cross-sectional view showing second example of a stripper penetration path applied to the thin film transistor substrate.
Figure 12B:
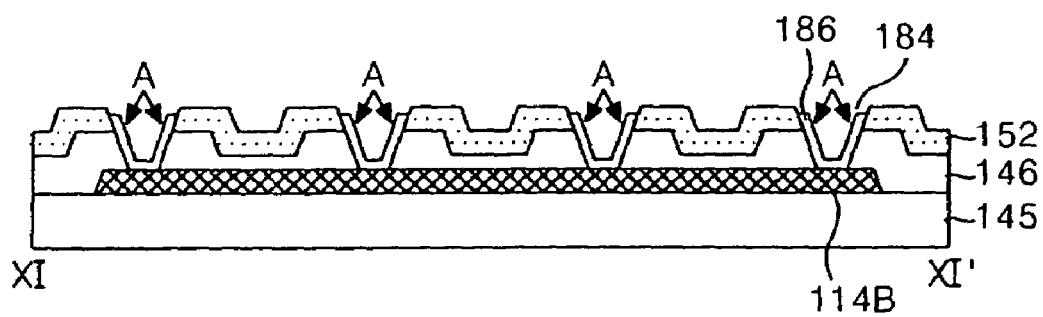

The second example is described referring to FIG. 12A and FIG. 12B. The plurality of stripper penetration paths 154 is formed from a plurality of holes 184 passing through the gate insulating film 146 and the protective film 152 on the extended portion 114B. A plurality of dummy transparent conductive patterns 186 is formed within each of the plurality of holes 184. The plurality of holes 184 may be provided on any one of a plurality of signal lines and electrodes including the gate line 102, the common line 116, the data line 104, the pixel electrode 114, and a portion of the drain electrode 112.

Figure 13:
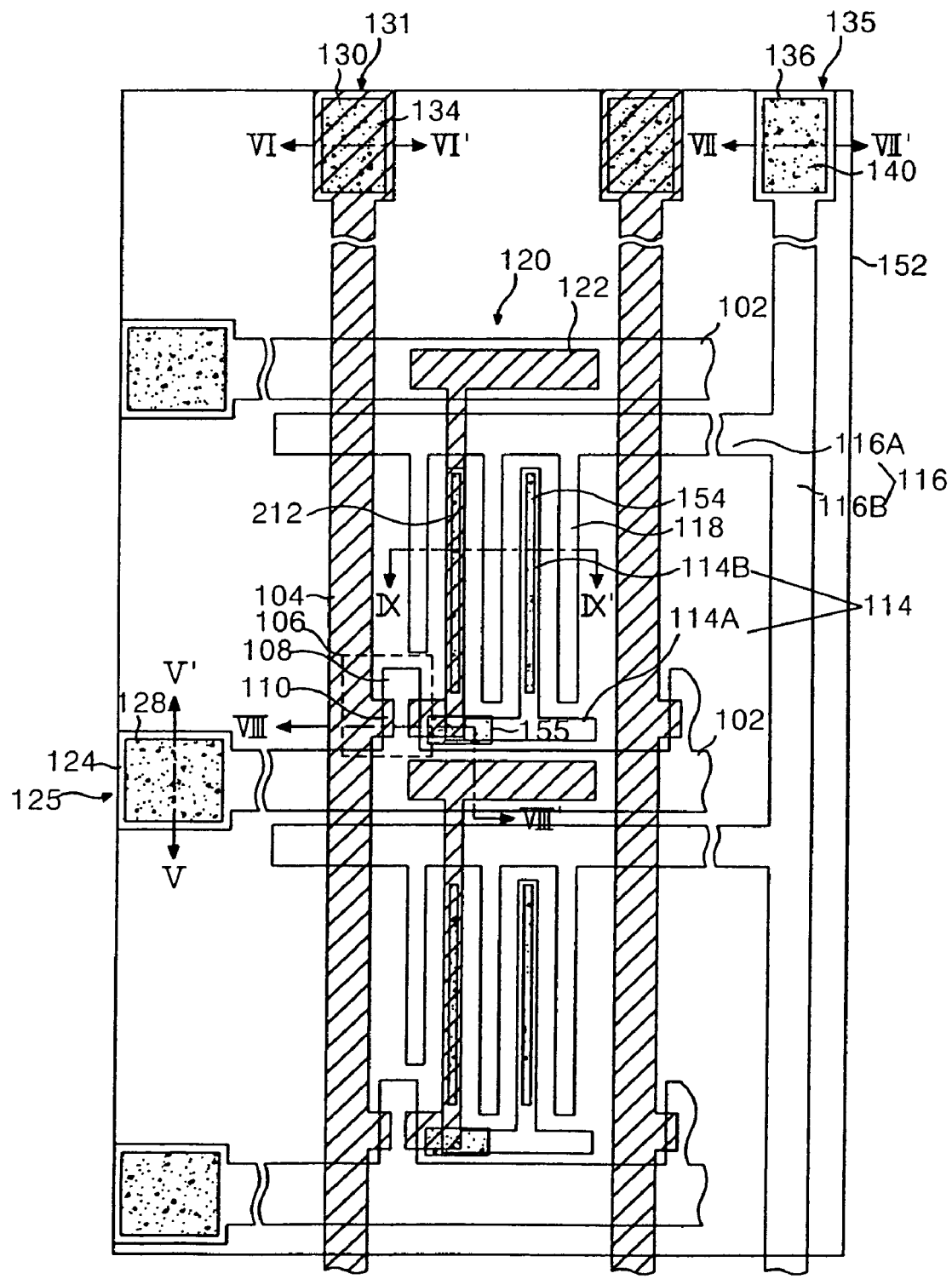
FIG. 13 is a plan view showing a structure of a thin film transistor substrate for a horizontal electric field type LCD according to a second exemplary embodiment of the present invention.
Figure 14:
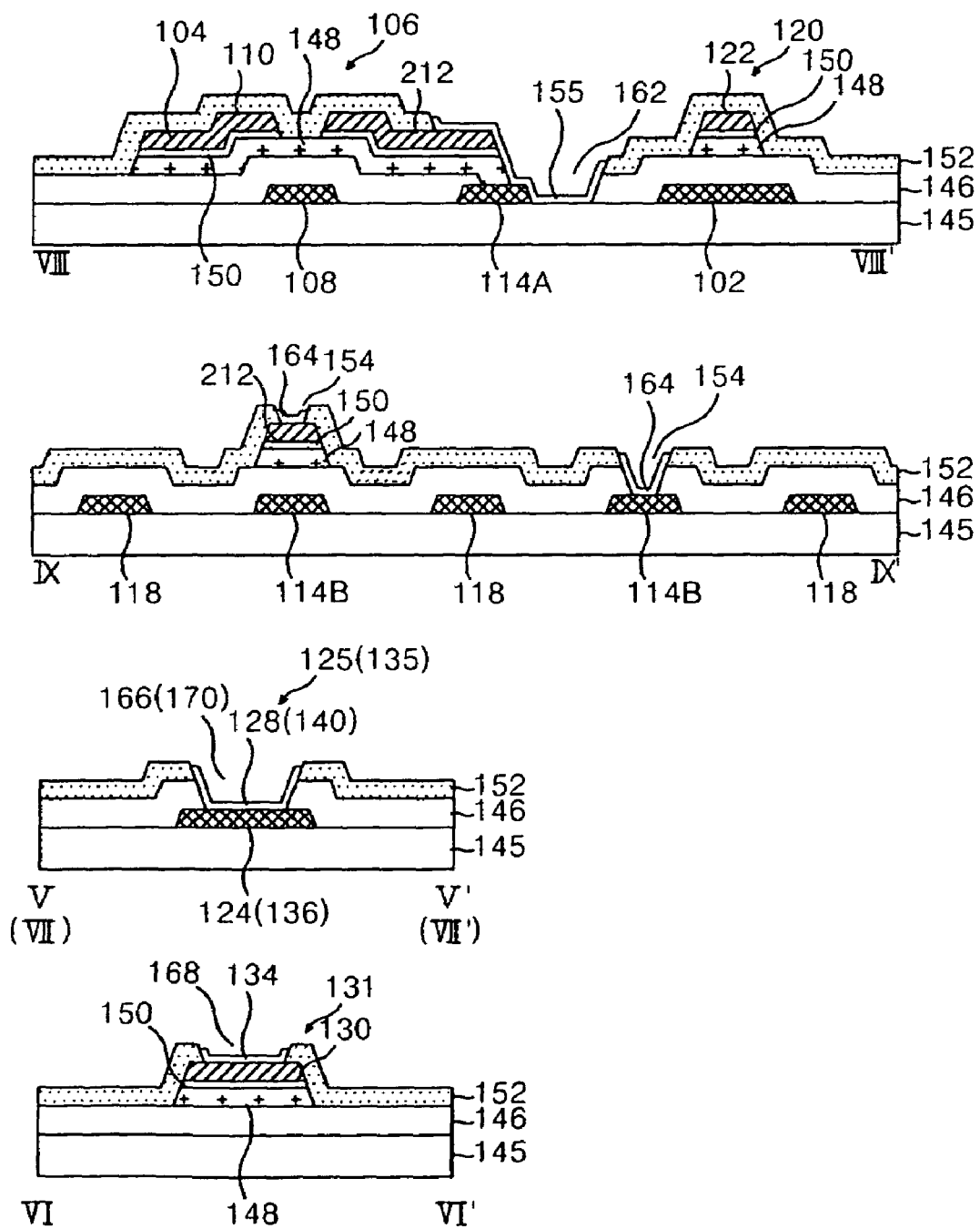
FIG. 14 is a cross-sectional view of the thin film transistor substrate taken along lines V-V', VI-VI', VII-VII', VIII-VIII' and IX-IX' of FIG. 13.

FIG. 13 is a plan view showing a structure of a thin film transistor substrate of a horizontal electric field type LCD according to a second embodiment of the present invention. FIG. 14 is a cross-sectional view of the thin film transistor substrate taken along lines V-V', VI-VI', VII-VII', VIII-VIII' and IX-IX' of FIG. 13. The thin film transistor substrate shown in FIG. 13 and FIG. 14 has a structure in which the second storage capacitor 126 is removed from the thin film transistor substrate shown in FIG. 4 and FIG. 5. Accordingly, a detailed explanation of the similar elements will be omitted.

A storage capacitor 120 includes a lower storage electrode formed continuous with a gate line 102, and an upper storage electrode 122 overlapping the lower storage electrode. A gate insulating film 146, an active layer 148 and an ohmic contact layer 150 are disposed between the upper storage electrode 122 and the lower storage electrode 120, and insulating each other. The upper storage electrode 122 is connected to a drain electrode 212. The drain electrode 212 overlaps an extended portion 114B of the pixel electrode 114 and is integrated with the upper storage electrode 122 across an internal common line 116A. Furthermore, a plurality of stripper penetration path 154 passing through the protective film 152 is formed on an extending portion of the drain electrode 212.

The thin film transistor substrate according to the second embodiment of the present invention having the above-mentioned structure is provided by the three-round mask process applying the lift-off process. More specifically, the gate metal pattern group including the gate line 102, the gate electrode 108, the lower gate pad electrode 124, the common line 116, the common electrode 118, the lower common pad electrode 136, and the pixel electrode 114 are disposed by the first mask process.

Next, a semiconductor pattern including the active layer 148 and the ohmic contact layer 150 are disposed on the gate insulating film 146, followed by a source/drain metal group including the data line 104, the source electrode 110, the drain electrode 212, the lower data pad electrode 130 and the upper storage electrode 122. Both the semiconductor pattern and the a source/drain metal group are disposed by the second mask process.

First to fourth contact holes 162, 166, 170, 168, and a plurality of stripper penetration paths 154 are provided passing through either the protective film 152 and the gate insulating film 146 or the protective film 152 alone, by the third mask process. Then, a transparent conductive pattern group including the upper gate pad electrode 128, the upper data pad electrode 134, the upper common pad electrode 140, the contact electrode 155 and a plurality of dummy transparent conductive pattern 164 are disposed at the first to fourth contact holes 162, 166, 170, 168, and the stripper penetration path 154, respectively. The transparent conductive pattern group is disposed by the lift-off process of the photo-resist pattern included in the third mask process.

As described above, according to the present invention, the lift-off process is employed to reduce the total number of mask processes required for fabricating the thin film transistor substrate. Accordingly, the thin film transistor substrate is fabricated by the three-round mask process simplifying the mask process, reducing the manufacturing cost, and improving the production yield.

It will be apparent to those skilled in the art that various modifications and variations can be made in the thin film transistor substrate of horizontal electronic field applying type and fabricating method thereof of the present invention without departing from the spirit or scope of the invention. Thus, it is intended that the present invention covers the modifications and variations of this invention provided they come within the scope of the appended claims and their equivalents.

What is claimed is:

1. A thin film transistor substrate of a horizontal electric field type LCD, comprising:
   a substrate;
   a gate line and a common line disposed on the substrate and arranged parallel with each other;
   a data line disposed on the substrate intersecting with the gate line and the common line, the data line insulated from the gate line and the common line by a gate insulating film therebetween, a pixel area being defined by the intersection of the data line with the gate line;
   a thin film transistor disposed at the intersection of the data line and the gate line, and connected to the gate line and the data line;
   a common electrode disposed having a portion extended into the pixel area and connected the common line;
   a pixel electrode disposed having a portion extended into the pixel area and connected to the thin film transistor, wherein a horizontal electric field is formed by the pixel electrode and the common electrode;
   a protective film disposed over the common electrode, pixel electrode, data line, gate line, common line, and the thin film transistor;
   at least one pad structure including a gate pad, a common pad, and a data pad, wherein each of the pads includes a lower pad electrode and an upper pad electrode, wherein the lower pad electrode is connected to a respective one of the gate line, common line, and data line the upper pad electrode is disposed within a respective one of first to contact third holes defined through the protective film to contact the lower pad electrode such that the upper pad electrode is absent from the upper surface of the protective film; and
   a fourth contact hole defined through the protective film for the gate pad, pixel electrode, and a portion of a drain electrode, wherein a contact electrode disposed within the contact holes to contact a portion of the pixel electrode and the portion of the drain electrode such that the contact electrode is absent from the upper surface of the protective film.

2. The thin film transistor substrate of a horizontal electric field type LCD according to claim 1, further comprises a plurality of dummy transparent conductive patterns is disposed within a plurality of stripper penetration paths defined through the protective film such that the plurality of dummy transparent conductive pattern are absent from the upper surface of the protective film.

3. The thin film transistor substrate of a horizontal electric field type LCD according to claim 2, wherein the plurality of stripper penetration paths are formed on at least respective one of the gate line, data line, common line, pixel electrode, and common electrode.

4. The thin film transistor substrate of a horizontal electric field type LCD according to claim 3, wherein the first to fourth contact holes and the plurality of stripper penetration paths are formed either through the gate insulating film and the protective film or through the protective film alone.

5. The thin film transistor substrate of a horizontal electric field type LCD according to claim 2, Wherein the plurality of stripper penetration paths define a shape of a slit or a hole.

6. The thin film transistor substrate of a horizontal electric field type LCD according to claim 2, wherein a plurality of dummy transparent conductive patterns are contacted on at least respective one of the gate line, data line, common line, and pixel electrode through the plurality of stripper penetration paths.

7. The thin film transistor substrate of a horizontal electric field type LCD according to claim 2, wherein an upper gate pad electrode, an upper common pad electrode, an upper data pad electrode, the contact electrode and the plurality of dummy transparent conductive pattern interface with the protective film.

8. The thin film transistor substrate of a horizontal electric field type LCD according to claim 1, further comprises a first storage capacitor including a first lower storage electrode disposed continuous with the gate line, a first upper storage electrode disposed overlapping the first lower storage electrode, wherein the gate insulating film is disposed between the first upper storage electrode and the first lower storage electrode, and the first upper storage electrode is connected to a drain electrode of the thin film transistor.

9. The thin film transistor substrate of a horizontal electric field type LCD according to claim 8, wherein the drain electrode has an extended portion that overlaps the extended portion of the pixel electrode, and the extended portion of the drain electrode is integrated with an extended portion of the first upper storage electrode.

10. The thin film transistor substrate of a horizontal electric field type LCD according to claim 8, further comprises a second storage capacitor including a second lower storage electrode disposed continuous with the common line and the common electrode, a second upper storage electrode disposed overlapping the second lower storage electrode, wherein the gate insulating film is disposed between the second upper storage electrode and the second lower storage electrode, and wherein the second upper storage electrode is disposed between the drain electrode and the first upper storage electrode.

11. The thin film transistor substrate of a horizontal electric field type LCD according to claim 10, wherein the second upper storage electrode extends from the first upper storage electrode and crosses the common line, wherein the second upper storage electrode overlaps a portion of the common electrodes connected to the common line, and wherein a portion of the second upper storage electrode is integrated with the drain electrode.

12. The thin film transistor substrate of a horizontal electric field type LCD according to claim 11, further comprises a semiconductor pattern of an active layer and an ohmic contact layer, the semiconductor pattern overlapping the data line, the lower data pad electrode, the first and second upper storage electrodes, source electrode, and the drain electrode.

13. The thin film transistor substrate of a horizontal electric field type LCD according to claim 1, wherein the pixel electrode is formed from a metal material identical to that of the gate line, common line, and the common electrode.

14. A thin film transistor substrate of a horizontal electric field type LCD, comprising:
    a substrate;
    a gate line and a common line disposed on the substrate and arranged parallel with each other;
    a data line disposed on the substrate intersecting with the gate line and the common line, the data line insulated from the gate line and the common line by a gate insulating film therebetween, a pixel area being defined by the intersection of the data line with the gate line;
    a thin film transistor disposed at the intersection of the data line and the gate line, and connected to the gate line and the data line;

a common electrode disposed having a portion extended into the pixel area and connected to the common line;

a pixel electrode disposed having a portion extended into the pixel area and connected to the thin film transistor, wherein a horizontal electric field is formed by the pixel electrode and the common electrode;

a protective film disposed over the common electrode, pixel electrode, data line common line, and the thin film transistor;

first to fourth contact holes and a plurality of stripper penetration paths provided on the substrate;

a gate pad including a lower gate pad electrode connected to the gate line and an upper gate pad electrode disposed within a first contact hole defined through the protective film to contact the lower gate pad electrode such that the upper gate pad electrode is absent from the upper surface of the protective film;

a common pad including a lower common pad electrode connected to the common line and an upper common pad electrode disposed within a second contact hole defined through the protective film to contact the lower common pad electrode such that the upper common pad electrode is absent from the upper surface of the protective film;

a data pad including a lower data pad electrode connected to the data line and an upper data pad electrode disposed within a third contact hole defined through the protective film to contact the lower data pad electrode such that the upper data pad electrode is absent from the upper surface of the protective film;

a contact electrode disposed within a fourth contact hole defined through the protective film to contact a portion of the pixel electrode and a portion of a drain electrode such that the contact electrode is absent from the upper surface of the protective film; and a plurality of dummy transparent conductive pattern disposed within the plurality of stripper penetration paths defined through the protective film such that the plurality of dummy transparent conductive pattern are absent from the upper surface of the protective film.

* * * * *